United States Patent
Zhang

(10) Patent No.: US 9,685,456 B2
(45) Date of Patent: Jun. 20, 2017

(54) METHOD FOR MANUFACTURING A TRANSISTOR HAVING A SHARP JUNCTION BY FORMING RAISED SOURCE-DRAIN REGIONS BEFORE FORMING GATE REGIONS AND CORRESPONDING TRANSISTOR PRODUCED BY SAID METHOD

(71) Applicant: STMicroelectronics, Inc., Coppell, TX (US)

(72) Inventor: John Hongguang Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/887,814

(22) Filed: Oct. 20, 2015

(65) Prior Publication Data

US 2017/0069661 A1    Mar. 9, 2017

Related U.S. Application Data

(60) Provisional application No. 62/241,983, filed on Oct. 15, 2015, provisional application No. 62/214,314, filed on Sep. 4, 2015.

(51) Int. Cl.
  *H01L 27/12*    (2006.01)
  *H01L 29/08*    (2006.01)
  (Continued)

(52) U.S. Cl.
  CPC .... *H01L 27/1203* (2013.01); *H01L 21/02532* (2013.01); *H01L 21/02546* (2013.01);
  (Continued)

(58) Field of Classification Search
  CPC .............. H01L 27/1203; H01L 21/84; H01L 29/66522; H01L 29/66545; H01L 29/6656;
  (Continued)

(56) References Cited

U.S. PATENT DOCUMENTS 6,551,885 B1 * 4/2003 Yu .................... H01L 29/458
                                                         257/382
6,727,186 B1 * 4/2004 Skotnicki .......... H01L 21/28167
                                                         257/E21.193

(Continued)

OTHER PUBLICATIONS

Mizushima, I. et. al.: Empty-space-in-silicon technique for fabricating silicon-on-nothing structure, in: Applied Physics Letters, vol. 77, No. 20, Nov. 13, 2000, pp. 3290-3292.*

*Primary Examiner* — A. Sefer
*Assistant Examiner* — Vincent Wall
(74) *Attorney, Agent, or Firm* — Gardere Wynne Sewell LLP

(57) ABSTRACT

A transistor device is fabricated by growing an epitaxial layer of semiconductor material on a semiconductor layer and forming an opening extending through the epitaxial layer at a position where a gate is to be located. This opening provides, from the epitaxial layer, a source epitaxial region on one side of the opening and a drain epitaxial region on an opposite side of the opening. The source epitaxial region and a first portion of the semiconductor layer underlying the source epitaxial region are then converted into a transistor source region. Additionally, the drain epitaxial region and a second portion of the semiconductor layer underlying the drain epitaxial region are converted into a transistor drain region. A third portion of the semiconductor layer between the transistor source and drain regions forms a transistor channel region. A transistor gate electrode is then formed in the opening above the transistor channel region.

25 Claims, 23 Drawing Sheets

(51) Int. Cl.
    *H01L 29/06*     (2006.01)
    *H01L 21/762*     (2006.01)
    *H01L 21/02*     (2006.01)
    *H01L 29/161*     (2006.01)
    *H01L 29/20*     (2006.01)
    *H01L 29/66*     (2006.01)
    *H01L 21/84*     (2006.01)

(52) U.S. Cl.
    CPC .. *H01L 21/02675* (2013.01); *H01L 21/76283* (2013.01); *H01L 21/84* (2013.01); *H01L 29/0649* (2013.01); *H01L 29/0847* (2013.01); *H01L 29/161* (2013.01); *H01L 29/20* (2013.01); *H01L 29/6656* (2013.01); *H01L 29/66522* (2013.01); *H01L 29/66545* (2013.01)

(58) Field of Classification Search
    CPC ......... H01L 21/02546; H01L 21/02675; H01L 29/0649; H01L 29/20; H01L 29/161; H01L 29/0847; H01L 21/76283; H01L 21/02532
    See application file for complete search history.

(56) References Cited

U.S. PATENT DOCUMENTS

| | | | | |
|---|---|---|---|---|
| 7,285,829 | B2* | 10/2007 | Doyle | H01L 21/28079 257/368 |
| 2009/0242873 | A1* | 10/2009 | Pillarisetty | H01L 29/42316 257/24 |
| 2009/0315074 | A1* | 12/2009 | Wang | H01L 29/0649 257/190 |
| 2011/0147713 | A1* | 6/2011 | Pillarisetty | H01L 29/66462 257/24 |

* cited by examiner

METHOD FOR MANUFACTURING A TRANSISTOR HAVING A SHARP JUNCTION BY FORMING RAISED SOURCE-DRAIN REGIONS BEFORE FORMING GATE REGIONS AND CORRESPONDING TRANSISTOR PRODUCED BY SAID METHOD

CROSS-REFERENCE TO RELATED APPLICATIONS

This application claims priority to U.S. Provisional Application for Patent No. 62/214,314 filed Sep. 4, 2015 and U.S. Provisional Application for Patent No. 62/241,983 filed Oct. 15, 2015, the disclosures of which are hereby incorporated by reference.

TECHNICAL FIELD

The present invention relates to integrated circuits and, in particular, to a field effect transistor (FET) device.

BACKGROUND

Techniques for the fabrication of field effect transistor (FET) devices are well known to those skilled in the art. For a conventional planar device, the process for device fabrication will typically form a gate stack over a substrate and then use the gate stack as a mask for the implantation of the source-drain regions on either side of the gate stack. It is further known in the art to subsequently use epitaxial growth to produce raised source-drain regions. The gate stack may comprise the actual gate electrode (as known in a technique referred to as "gate first" fabrication) or comprise a dummy gate (as known in a technique referred to as "gate last" or replacement metal gate (RMG) fabrication).

As the technology node continues to shrink, the scaling of the FET devices requires higher mobilities in the transistor channel region. Additionally, aggressively scaled FET devices further require a very sharp junction between the source-drain region and the channel region. The conventional processes described above for device fabrication, however, have a number of issues which become more significant as device sizes shrink. For example, it is difficult to provide a fully strained channel with high mobility for both n-channel and p-channel devices. Another issue concerns the formation of diffused junctions which degrade short channel control. Another issue with diffused junctions is an increase in resistance in the extension region of the transistor device resulting in reduced device performance. Another issue relates to pitch scaling which can introduce challenges in block level patterning. It is also recognized that resist residues at tight pitches necessitate the use of high energy extension implants, and these implants can worsen the diffused junction concerns noted above.

A need accordingly exists in the art for an improved transistor device manufacturing process that addresses the foregoing and other issues and provides a high mobility channel region and a sharp junction between the source-drain region and the channel region.

SUMMARY

In an embodiment, a method comprises: forming, in a first active area, a first upper semiconductor layer separated by a first intervening layer from a first lower semiconductor layer; forming, in a second active area, a second upper semiconductor layer separated by a second intervening layer from a second lower semiconductor layer; insulating the first active area from the second active area with an anchor structure; forming a first epitaxial layer on the first upper semiconductor layer, said first epitaxial layer doped with a first dopant; forming a second epitaxial layer on the second upper semiconductor layer, said second epitaxial layer doped with a second dopant different from the first dopant; and removing material of the first and second intervening layers to form first and second cavities, respectively, under the first and second upper semiconductor layers.

In an embodiment, a method comprises: forming in an active area an upper semiconductor layer separated by an intervening layer from a lower semiconductor layer; forming an epitaxial layer on the upper semiconductor layer, said epitaxial layer doped with a dopant; removing material of the intervening layer to form a cavity under the upper semiconductor layer; forming an opening extending through said epitaxial layer at a position where a gate is to be located to provide, from said epitaxial layer, a source epitaxial region on one side of said opening and a drain epitaxial region on an opposite side of said opening; converting the source epitaxial region and a first portion of the upper semiconductor layer underlying the source epitaxial region into a transistor source region; converting the drain epitaxial region and a second portion of the upper semiconductor layer underlying the drain epitaxial region into a transistor drain region; wherein a third portion of the upper semiconductor layer between the transistor source and drain regions forms a transistor channel region; and forming a transistor gate electrode in said opening above the transistor channel region.

In an embodiment, an integrated circuit transistor comprises: an upper semiconductor layer separated by a cavity from a lower semiconductor layer; an epitaxial layer on said upper semiconductor layer and including an opening extending through said epitaxial layer to provide, from said epitaxial layer, a source epitaxial region on one side of said opening and a drain epitaxial region on an opposite side of said opening; a transistor source region comprising a conversion of said source epitaxial region and a first portion of the upper semiconductor layer underlying the source epitaxial region; a transistor drain region comprising a conversion of said drain epitaxial region and a second portion of the upper semiconductor layer underlying the drain epitaxial region; wherein a third portion of the upper semiconductor layer between transistor source and drain regions forms a transistor channel region; and a transistor gate electrode in said opening above the transistor channel region.

In an embodiment, a method comprises: in an active region of a semiconductor layer, growing an epitaxial layer of semiconductor material on said semiconductor layer; forming an opening extending through said epitaxial layer of semiconductor material at a position where a gate is to be located to provide, from said epitaxial layer of semiconductor material, a source epitaxial region on one side of said opening and a drain epitaxial region on an opposite side of said opening; converting the source epitaxial region and a first portion of the semiconductor layer underlying the source epitaxial region into a transistor source region; converting the drain epitaxial region and a second portion of the semiconductor layer underlying the drain epitaxial region into a transistor drain region; wherein a third portion of the semiconductor layer between the transistor source and drain regions forms a transistor channel region; and forming a transistor gate electrode in said opening above the transistor channel region.

In an embodiment, an integrated circuit transistor comprises: a semiconductor layer including an active region; an epitaxial layer of semiconductor material on said semiconductor layer and including an opening extending through said epitaxial layer of semiconductor material to provide, from said epitaxial layer of semiconductor material, a source epitaxial region on one side of said opening and a drain epitaxial region on an opposite side of said opening; a transistor source region comprising a conversion of said source epitaxial region and a first portion of the semiconductor layer underlying the source epitaxial region; a transistor drain region comprising a conversion of said drain epitaxial region and a second portion of the semiconductor layer underlying the drain epitaxial region; wherein a third portion of the semiconductor layer between transistor source and drain regions forms a transistor channel region; and a transistor gate electrode in said opening above the transistor channel region.

In an embodiment, a method comprises: growing an epitaxial layer of semiconductor material on a semiconductor layer; forming an opening extending through said epitaxial layer of semiconductor material at a position where a gate is to be located to provide, from said epitaxial layer of semiconductor material, a source epitaxial region on one side of said opening and a drain epitaxial region on an opposite side of said opening; laser annealing on each side of said opening to recrystallize the source epitaxial region and a first portion of the semiconductor layer underlying the source epitaxial region into a transistor source region and recrystallize the drain epitaxial region and a second portion of the semiconductor layer underlying the drain epitaxial region into a transistor drain region; wherein a third portion of the semiconductor layer between the transistor source and drain regions is not subjected to laser annealing and forms a transistor channel region; and forming a transistor gate electrode in said opening above the transistor channel region.

In an embodiment, an integrated circuit transistor comprises: a semiconductor layer including an active region; an epitaxial layer of semiconductor material on said semiconductor layer; a dielectric layer on said epitaxial layer; an opening extending through said dielectric layer and said epitaxial layer of semiconductor material to provide: a transistor source region formed from a source epitaxial region on one side of said opening and a first portion of the semiconductor layer underlying the source epitaxial region; and a transistor drain region formed from a drain epitaxial region on opposite side of said opening and a second portion of the semiconductor layer underlying the drain epitaxial region; wherein a third portion of the semiconductor layer between transistor source and drain regions forms a transistor channel region; sidewall spacers on side walls of said opening adjacent the dielectric layer wherein a bottom-most surface of said sidewall spacers is in contact with a top surface of the transistor source and drain regions; a transistor gate electrode in said opening; and a dielectric layer in said opening and insulating the transistor gate electrode from the transistor source and drain regions.

In an embodiment, an integrated circuit transistor comprises: a semiconductor layer including an active region; an epitaxial layer of semiconductor material on said semiconductor layer and including an opening extending through said epitaxial layer of semiconductor material to provide: a transistor source region formed from a source epitaxial region on one side of said opening and a first portion of the semiconductor layer underlying the source epitaxial region; and a transistor drain region formed from a drain epitaxial region on opposite side of said opening and a second portion of the semiconductor layer underlying the drain epitaxial region; wherein a third portion of the semiconductor layer between transistor source and drain regions forms a transistor channel region; sidewall spacers on side walls of said opening; a transistor gate electrode in said opening and insulated in a lateral direction from the transistor source and drain regions by at least the sidewall spacers; and a dielectric layer at a bottom of said opening, said transistor gate electrode insulated in a vertical direction from the transistor source and drain regions and the transistor channel region solely by said dielectric layer at the bottom of said opening, said vertical direction being perpendicular to the lateral direction.

In an embodiment, a method comprises: in an active region of a semiconductor layer, growing an epitaxial layer of semiconductor material on said semiconductor layer; forming an insulating layer on the epitaxial layer of semiconductor material; forming a first opening extending through said insulating layer and stopping at said epitaxial layer of semiconductor material; forming insulating sidewall spacers on side walls of said first opening; using the sidewall spacers as a mask, extending the first opening through the epitaxial layer of semiconductor material to form a second opening; and forming an insulated transistor gate electrode in said second opening and adjacent to the sidewall spacers in said first opening.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-12 which illustrate the process steps in the formation of a substrate which supports a high mobility channel for both p-channel and n-channel transistor devices. It will be understood that the drawings do not necessarily show features drawn to scale.

Figure 1:
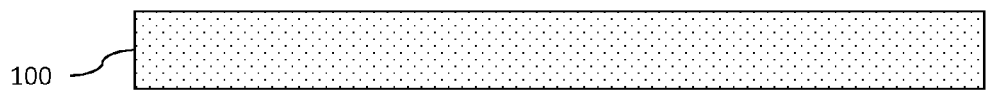
FIGS. 1-12 illustrate process steps in the formation of a substrate which supports a high mobility channel region for both p-channel and n-channel transistor devices.

FIG. 1 shows a bulk substrate 100 for example made of silicon. The bulk substrate 100 may, if desired, be doped as desired for the transistor application.

Figure 2:
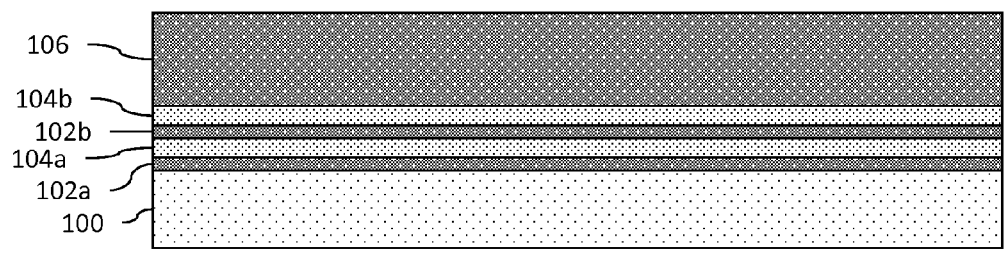

An epitaxial growth process is then performed to grow an epitaxial silicon-germanium (SiGe) layer 102a on the bulk substrate 100. The layer 102a comprises a stress release buffer layer having a thickness of, for example, 10-500 nm with a germanium content of 25-85%. An epitaxial growth process is then performed to grow a silicon layer 104a on the epitaxial silicon-germanium layer 102a. The layer 104a comprises a defect cap layer having a thickness of, for example, 50-100 nm. The epitaxial processes are repeated to deposit an epitaxial silicon-germanium layer 102b on silicon layer 104a and deposit a silicon layer 104b on the epitaxial silicon-germanium layer 102b (these layers having the same properties as the layers 102a and 104a). Although two repetitions of the epitaxial processes are described above and shown in FIG. 1, it will be understood that this is by example only and that any desired number of stacked epitaxial layers 102/104 may be used. A top epitaxial silicon-germanium layer 106 is then grown using an epitaxial growth process on the silicon layer 104b. The layer 106 is a defect free and fully stress released layer having a thickness of, for example, 10-2000 nm. The result is shown in FIG. 2.

Figure 3:
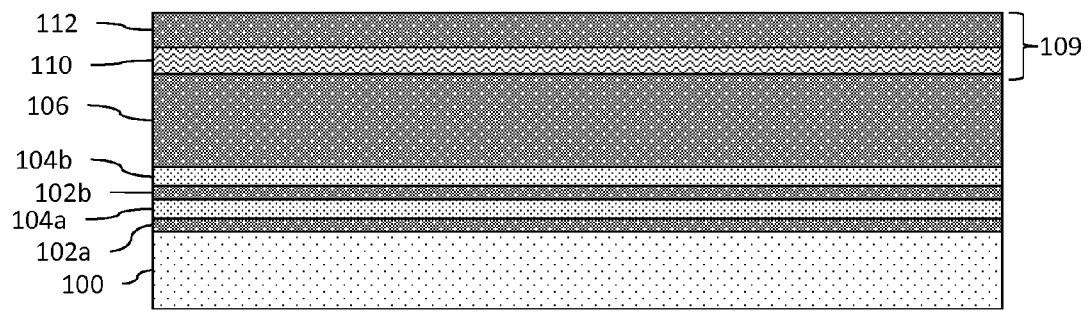

Using a wafer bonding technique as well known in the art and similar to the process used to form silicon-on-insulator (SOI) wafers, a wafer 109 including an insulator layer 110 and a semiconductor layer 112 is bonded to the layer 106. The insulator layer 110 may, for example, comprise any suitable insulator film material possessing a high selective removal rate relative to silicon-germanium or germanium. For example, the layer 110 is preferably an oxide such as SiGeO or GeO. The layer 112 may have a thickness of 5-200 nm. The semiconductor layer 112 may, for example, have a thickness of 10-200 nm and comprise silicon-germanium (with a germanium content of 25-85%) or germanium. The result is shown in FIG. 3.

Figure 4:
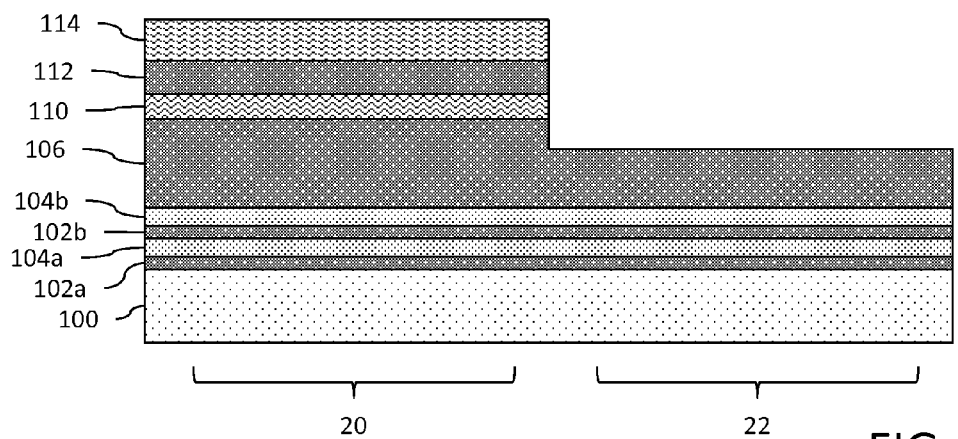

A hard mask 114 is deposited over a first active area 20 reserved for the formation of first polarity (for example, p-channel) metal oxide semiconductor devices (PMOS). A reactive ion etch (RIE) is then performed to remove the layers 110 and 112, as well as remove a portion of the layer 106, in a second active area 22 reserved for the formation of second, opposite, polarity (for example, n-channel) metal oxide semiconductor devices (NMOS). The result is shown in FIG. 4. The partial recessing of the layer 106 may, for example, be to a depth of 100-1500 nm.

Figure 5:
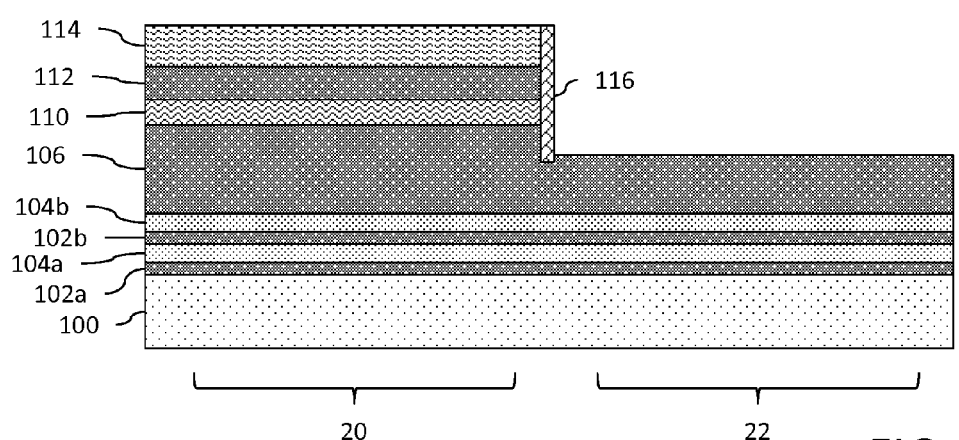

A silicon-nitride spacer 116 is then formed on the exposed sidewalls of the layers 106, 110 and 112 and mask 114 between the active areas 20 and 22. The spacer 116 may, for example, be formed using a plasma-enhanced chemical vapor deposition (PECVD) process or high density plasma chemical vapor deposition (HDPCVD) process and have a thickness of 30-150 nm. The result is shown in FIG. 5.

Figure 6:
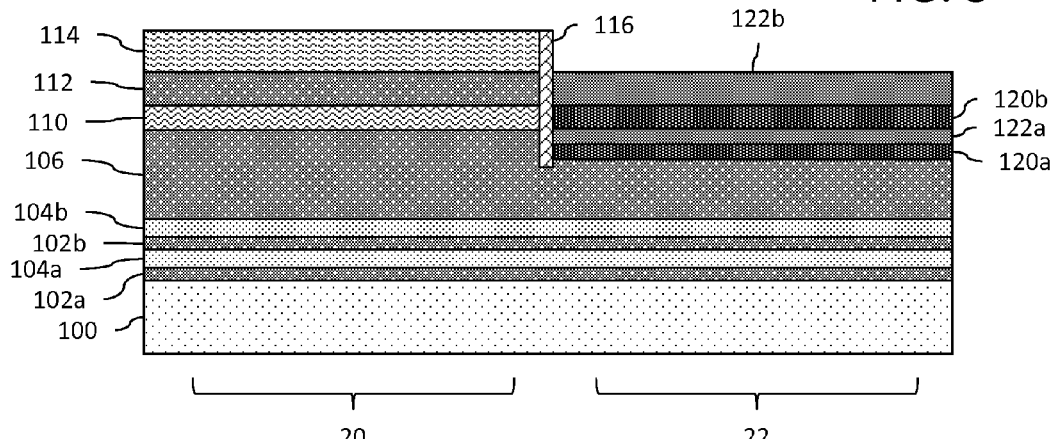

An epitaxial growth process is then performed to grow an epitaxial indium-phosphorous layer 120a (InP) on the layer 106 in the second active area 22. An epitaxial growth process is then performed to grow an epitaxial indium-gallium-arsenic layer 122a (InGaAs) on the layer 120a. The layers 120a, 122a form stress release buffer layers. The epitaxial processes are repeated to deposit an epitaxial indium-phosphorous layer 120b on layer 122a and deposit an indium-gallium-arsenic layer 122b on the layer 120b (these layers having the same properties as the layers 120a and 122a). The layers 120a and 120b may have a thickness of, for example, 5-500 nm. The layer 122a may have a thickness of, for example, 5-500 nm. The layer 122b is a defect free layer and may have a thickness of, for example, 5-800 nm. A top surface of the layer 122b is preferably substantially co-planar with a top surface of the layer 112 in the first active area 20. The result is shown in FIG. 6. Although two repetitions of the epitaxial processes are described above and shown in FIG. 6, it will be understood that this is by example only and that any desired number of stacked epitaxial layers 120/122 may be used.

Figure 7:
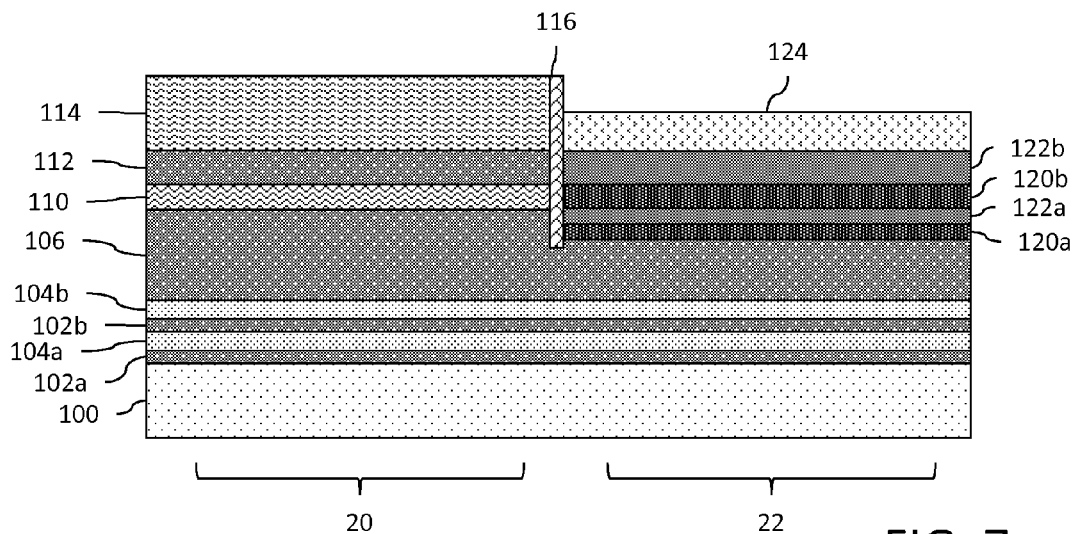

An epitaxial growth process is then performed to grow an indium-gallium-arsenic layer 124 (InGaAs) on the layer 122b in the second active area 22. The layer 124 is doped with silicon (Si) using either an in situ process during epitaxy or an implant process after epitaxy. As an alternate to silicon dopant, any suitable Group IV (Ge or Sn) or Group VI (S, Se, Te) dopant may instead be used. In an embodiment, the dopant concentration may comprise $1 \times 10^{19}$ to $5 \times 10^{20}$ at/cm$^3$. The layer 124 may, for example, have a thickness of 10-100 nm. The result is shown in FIG. 7. As an alternative, strained silicon could be used for layer 124 if its mobility were satisfactory for the transistor application, and in such a case the dopant would preferably comprise phosphorous. However, InGaAs/Si is preferred due to its higher electron mobility.

Figure 8:
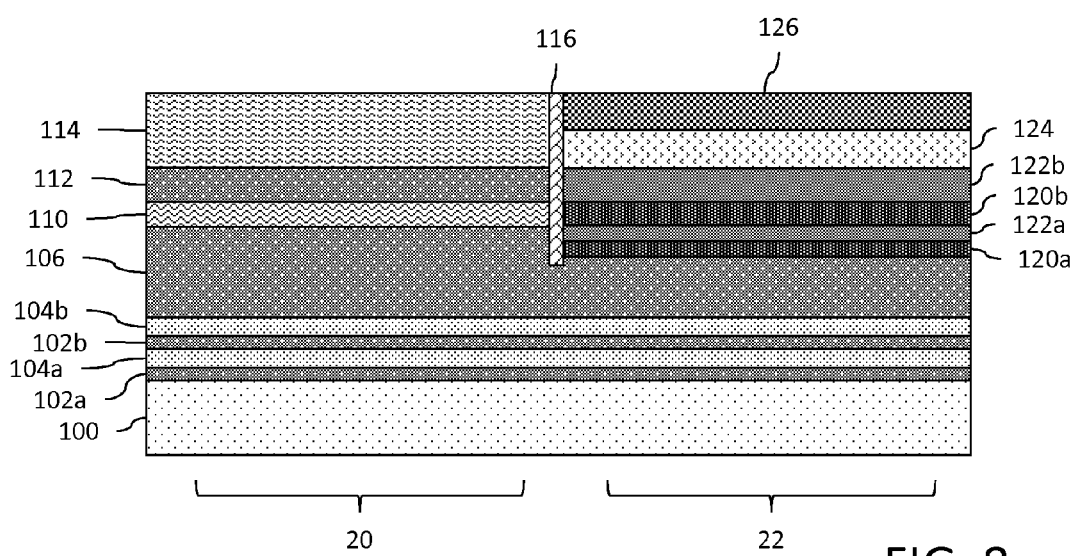

A hard mask material is then deposited on the wafer. A chemical mechanical polishing (CMP) process is performed to planarize the top surface and leave a hard mask 126 over the second active area 22. The result is shown in FIG. 8.

Figure 9:
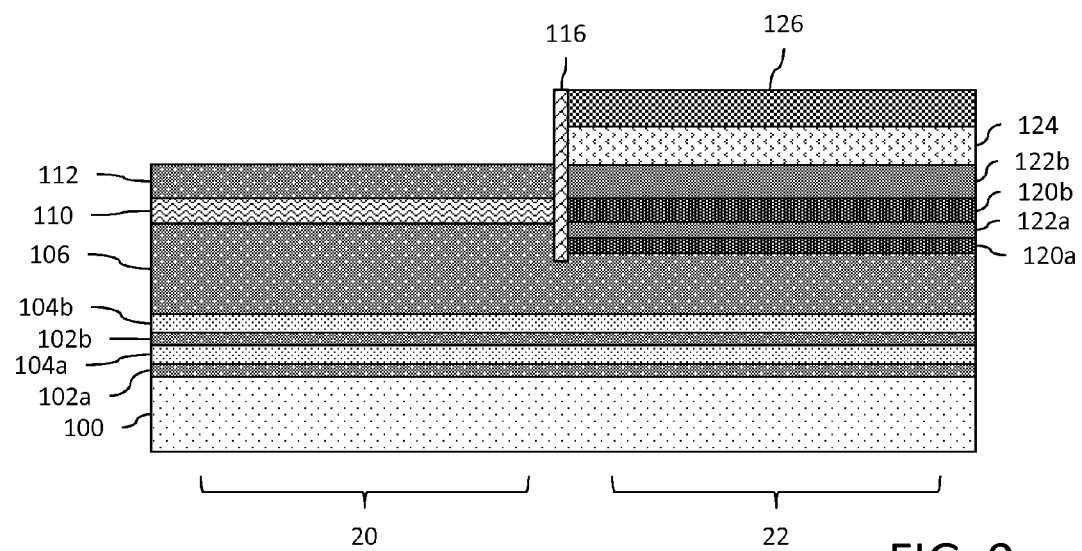

The hard mask 114 is then removed using a selected reactive ion etch (RIE) process that stops at the layer 112. The result is shown in FIG. 9.

Figure 10:
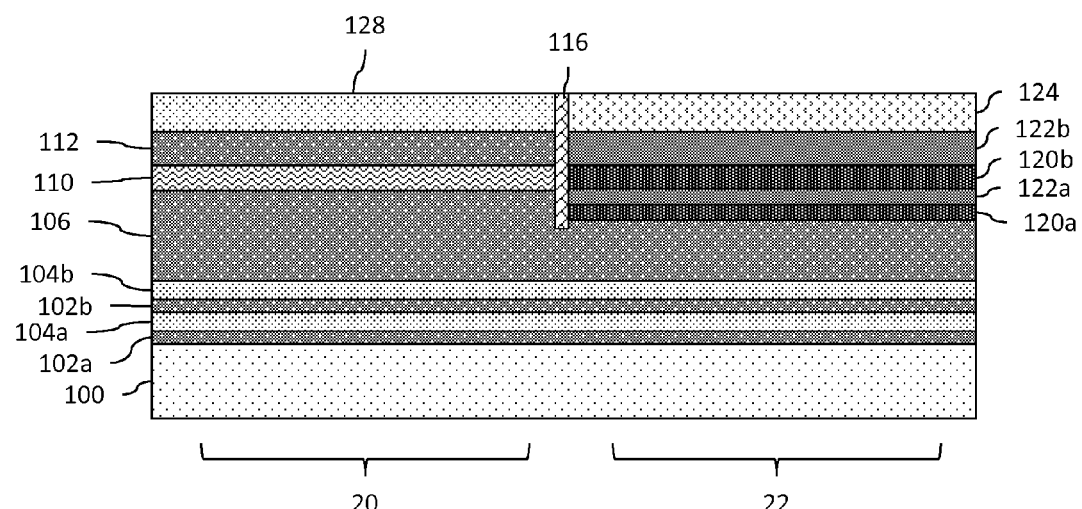

An epitaxial growth process is then performed to grow a silicon-germanium layer 128 (SiGe) on the layer 112 in the first active area 20. The layer 128 is doped with boron using an in situ process during epitaxy. In an embodiment, the dopant concentration may comprise $1 \times 10^{19}$ to $2 \times 10^{20}$ at/cm$^3$. The layer 128 may, for example, have a thickness of 10-100 nm. A chemical mechanical polishing (CMP) process may be performed to remove the mask 126 and planarize the top surface so that the top surfaces of the layers 124 and 128 are coplanar. The result is shown in FIG. 10.

Figure 11:
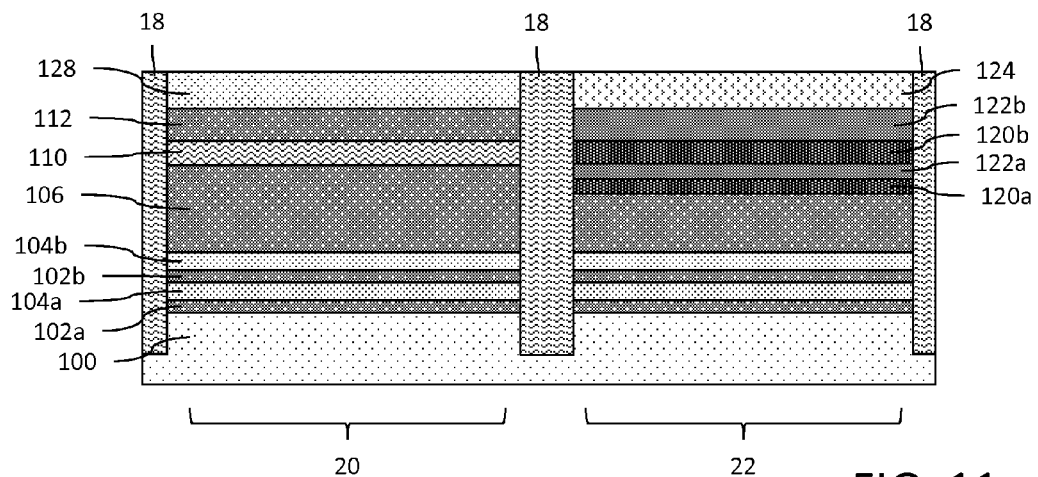

Shallow trench isolation (STI) structures 18 are then formed to delimit and isolate the first and second active areas 20 and 22. The result is shown in FIG. 11. It will be noted that STI structures 18 may be an optional inclusion if the silicon-nitride spacer 116 will be sufficient structurally for providing insulation and anchoring of the structural layers following the next step.

Access is made, for example through an etched opening, to the layers 110 and 120b. A selective removal process (for example, comprising a selective etch process) is then performed through the access to selectively remove the materials forming the layers 110 and 120b to leave a cavity 130 between the layers 106 and 112 in the first active area 20 and a cavity 132 between the layers 122a and 122b in the second active area 22. In an embodiment, a buffered hydrofluoric (BHF) acid etch may be used to remove SiGeO or GeO of layer 110 selectively relative to the SiGe of layers 106 and 112. In an embodiment, an H$_3$PO$_4$:HCl (3:1) etch may be used to remove InP of layer 120b selectively relative to the InGaAs of layers 122a and 122b. In this context, the each of the cavities 130 and 132 is a vacant space in the wafer that may be filled with air or a noble gas such as Ne or Ar depending on the process environment. Because of the removal of the layers 110 and 120b, it is important that the STI structures 18 (or silicon-nitride spacers 116) function as anchoring structures to support the peripheral edges of the layers 112, 122b, 124 and 128 suspended above the cavities 130 and 132. The result is shown in FIG. 12 to provide a substrate 100'.

Figure 12:
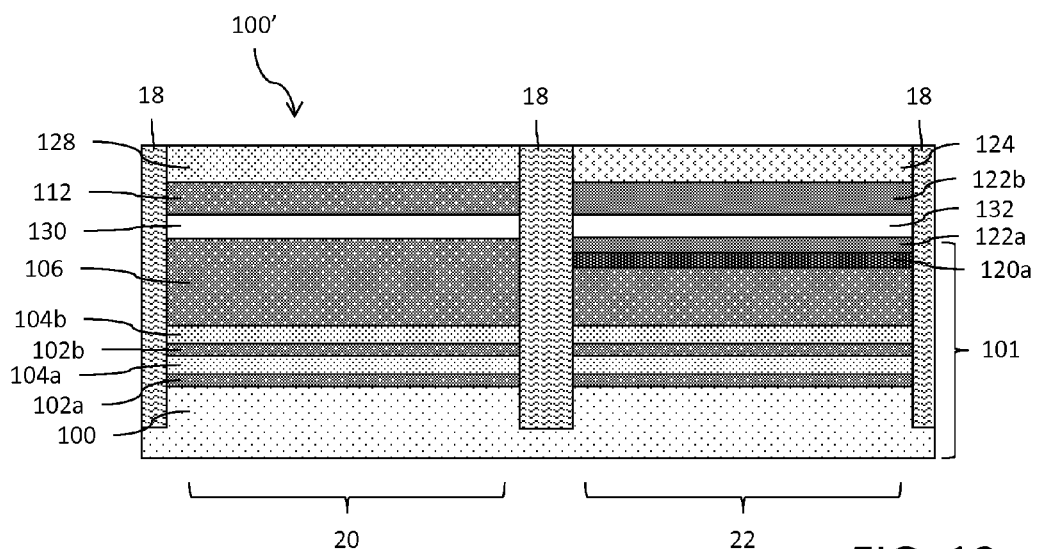

Reference is now made to FIGS. 13-20 which illustrate the process steps in the formation of CMOS devices with sharp junctions between the source-drain region and the high mobility channel region provided by a substrate 100' as shown in FIG. 12. It will be understood that the drawings do not necessarily show features drawn to scale.

Figure 13:
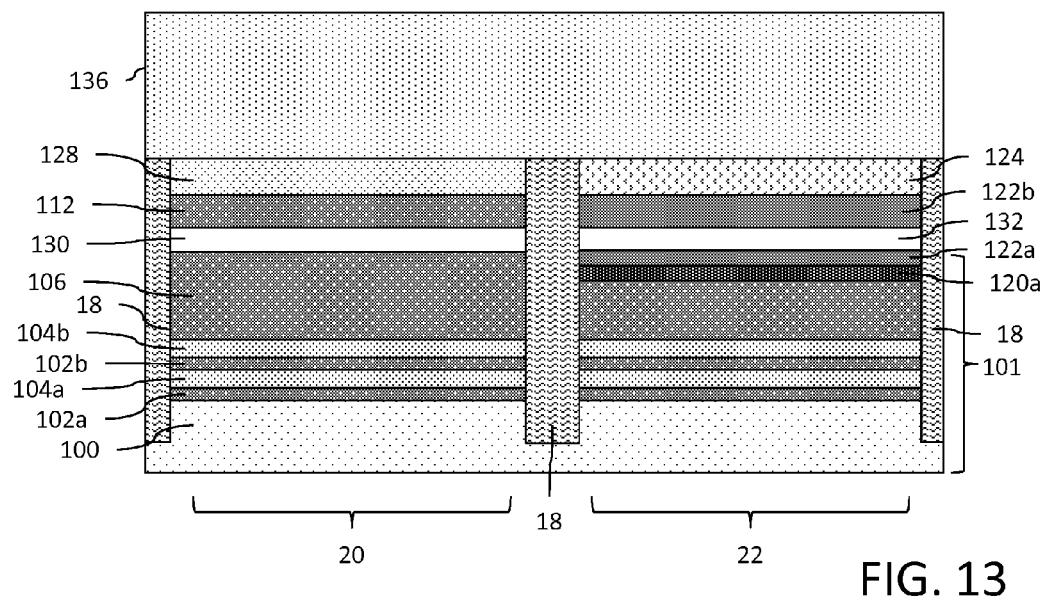
FIGS. 13-20 illustrate process steps in the formation of CMOS devices with sharp junctions between the source-drain region and the high mobility channel region provided by a substrate as shown in FIG. 12.

A layer 136 of sacrificial material is deposited over the substrate 100' wafer. The layer 136 covers the epitaxial layers 124 and 128 and the STI structures 18. If the layer 136 as deposited does not have a planar top surface, a conventional chemical-mechanical polishing (CMP) technique may be used to provide a planar top surface. The layer 136 may, for example, have a thickness of 40-400 nm. The layer 136 may be deposited using a chemical vapor deposition (CVD) process. The material used for layer 136 may, for example, comprise doped or undoped polysilicon. The result is shown in FIG. 13.

Figure 14:
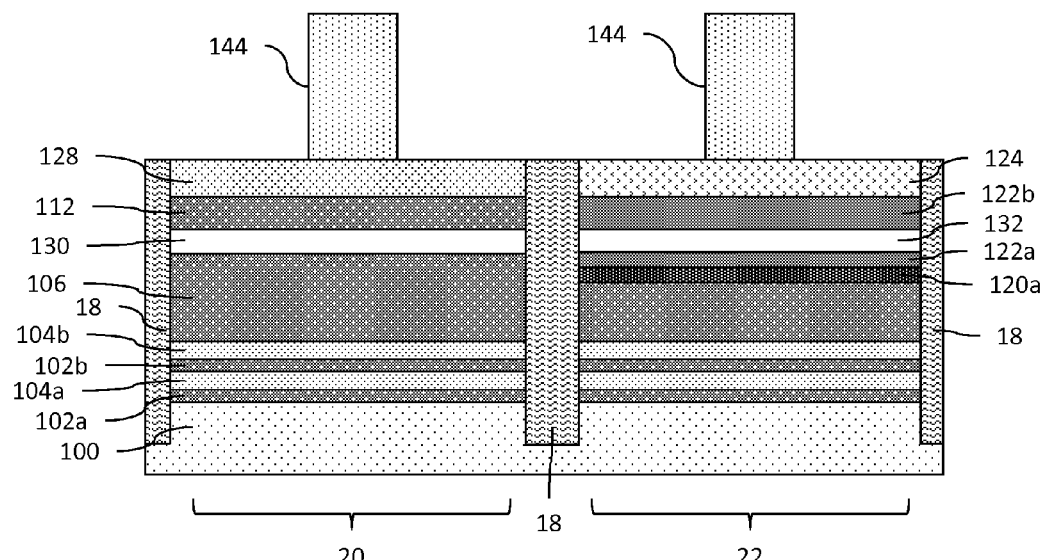

Using conventional lithographic processing techniques, the layer 136 is patterned to define a dummy gate 144 at each active region. The dummy gates 144 may, for example, be formed using a reactive ion etch (RIE). The dummy gates 144 may have a length of 10-80 nm and a width of 10-80 nm, where length and width are used here in the same way as those terms are used in connection with a transistor structure such that the length refers to the dimension extending between the source and drain and the width refers to the dimension perpendicular thereto. The result is shown in FIG. 14.

Figure 15:
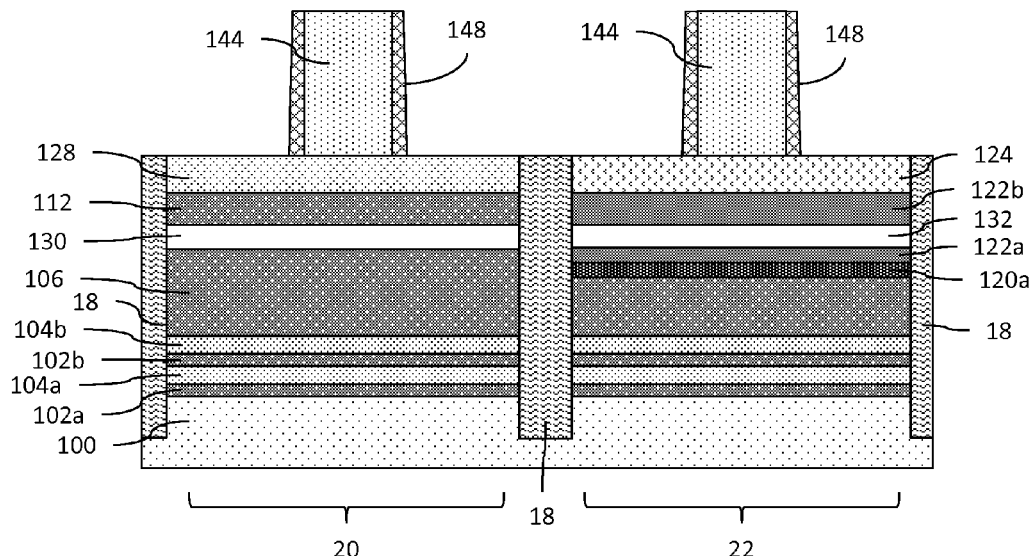

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 148 on the side walls of each dummy gate 144. The result is shown in FIG. 15. The low-K dielectric material may, for example, comprise SiN, SiBCN or SiOCN. The etch used to shape the sidewall spacers 148 may, for example, comprise a Lam mixed mode pulsing (MMP) deposition/etch/$O_2$ flash approach.

Figure 16:
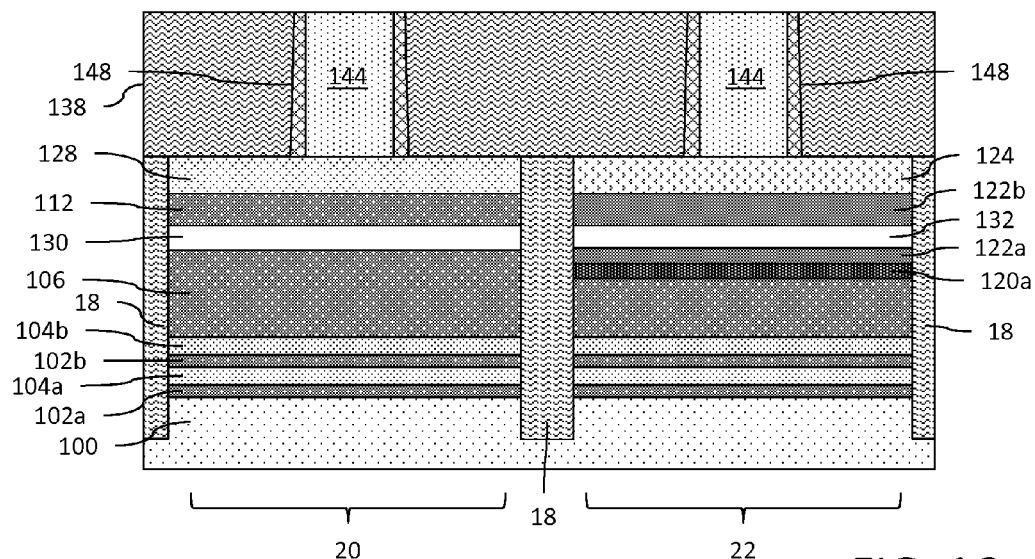

A layer 138 of dielectric material is then deposited over the wafer. The layer 138 covers the dummy gates 144, sidewall spacers 148, the epitaxial layers 124 and 128 and the STI structures 18. The layer 138 may, for example, have a thickness of 40-400 nm. The layer 138 may be deposited using a chemical vapor deposition (CVD) process. The material used for layer 138 may, for example, comprise silicon dioxide. A conventional chemical-mechanical polishing (CMP) technique is used to remove excess portions of layer 138 and provide a planar top surface coincident with the top of the dummy gate 144. The result is shown in FIG. 16.

Figure 17:
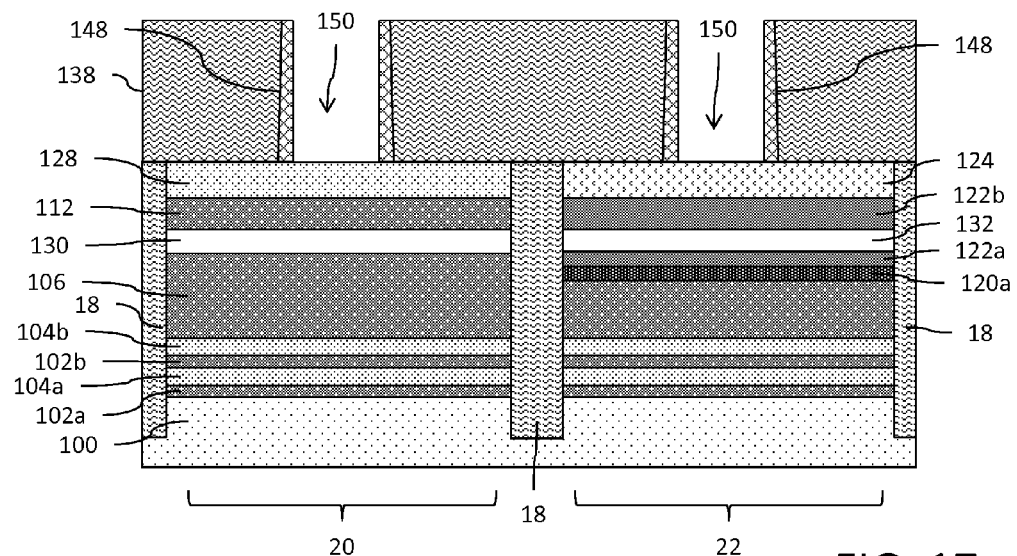

The dummy gate 144 is then selectively removed using a reactive ion etch (RIE) or wet etch or combination process to form openings 150. The result is shown in FIG. 17.

Figure 18:
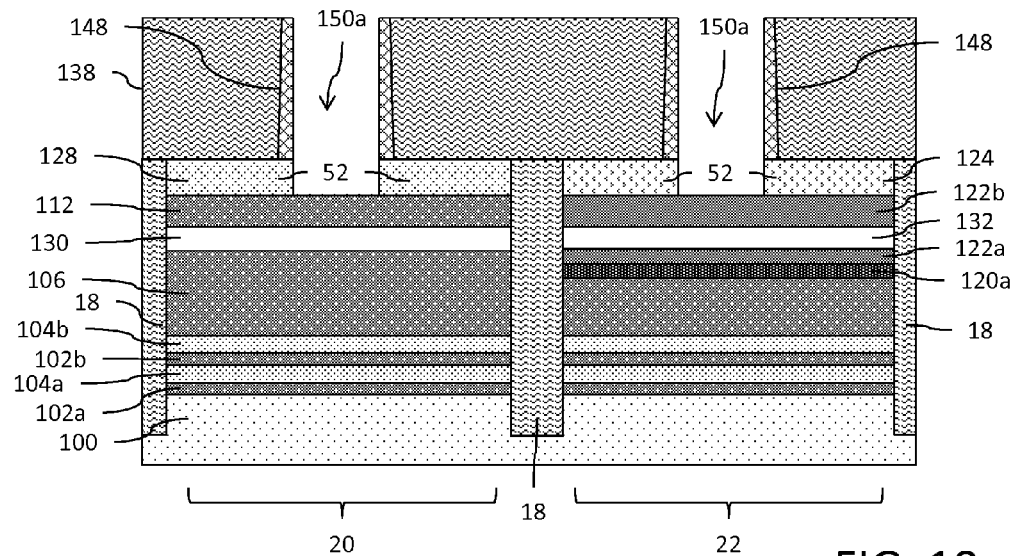

A directional etch, such as a reactive ion etch (RIE), is then performed to extend the opening 150 as opening 150a through the epitaxial layers 124 and 128 stopping on the layers 112 and 122b (such that sides of opening 150a are aligned with sides of opening 150). The result is shown in FIG. 18 to produce, from the epitaxial layers 124 and 128, a source epitaxial region on one side of the opening 150a and a drain epitaxial region on the opposite side of the opening 150a. The source and drain epitaxial regions are generally indicated at reference 52.

Figure 19:
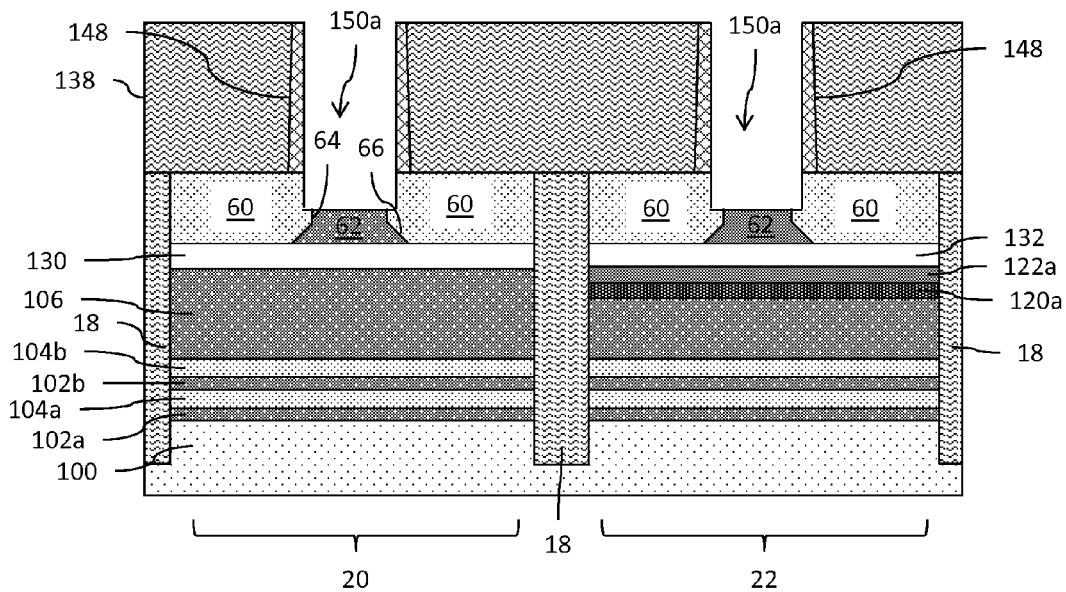

Using a laser annealing process, a recrystallization is performed to convert the source and drain epitaxial regions 52 and an underlying portion of the layers 112 and 122b into transistor source-drain regions 60. As an example, an Ultratech LXA288 may be used with an anneal temperature in a range from 800-1300° C. and a dwell time of 200-1600 μs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the layers 112 and 122b that remain after recrystallization define channel regions 62 that are fully strained to support high mobility. The result is shown in FIG. 19. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In a preferred implementation, the portions of the layers 112 and 122b below the source and drain epitaxial regions 52 are fully converted to single crystal throughout their thickness to the cavities 130 and 132. The p-n junction with the channel region in the layers 112 and 122b is defined by a substantially vertical junction interface portion 64 extending for a depth less than the thickness of layers 112 and 122b and a sloped junction interface portion 66 extending from the substantially vertical junction interface portion in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 10. The cavities 130 and 132 advantageously effectively prevent short channel effects and prevent current leakage when the transistor is in the off state.

Figure 20:
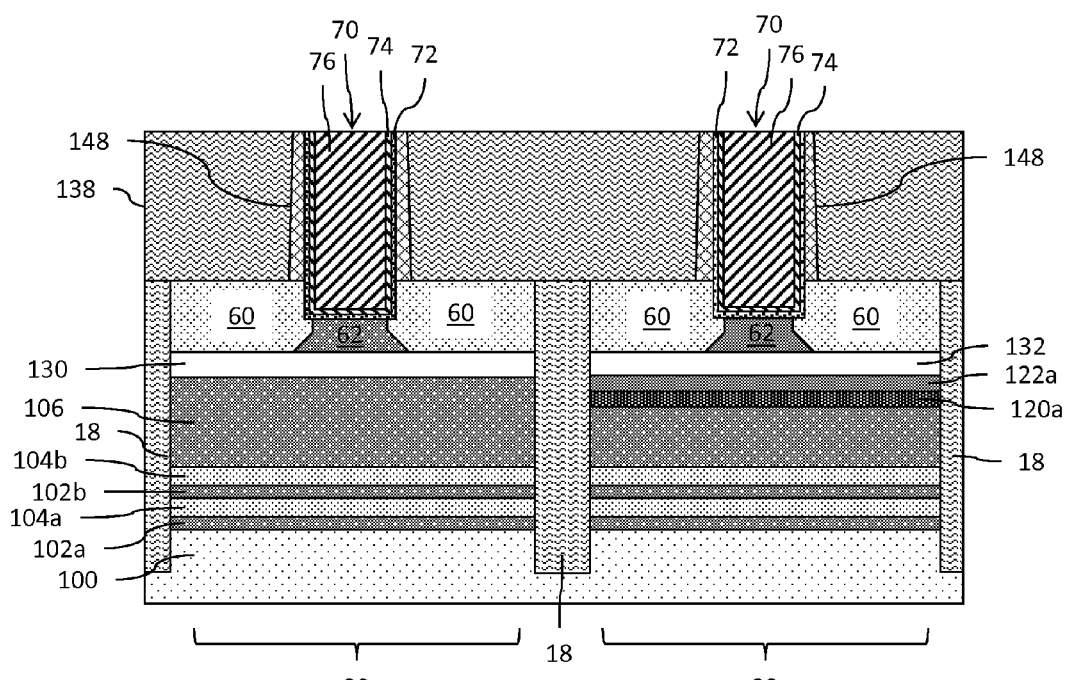

The openings 150 and 150a are then filled with the gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 20. The material for the high-K dielectric layer 72 may, for example, comprise $HfO_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that sidewall spacer 148 sits on top of the raised source-drain regions 60. In other words, a bottom-most surface of the sidewall spacer 148 is in contact with a top-most surface of the raised source-drain regions 60. The opening 150a permits the gate electrode (defined by metal 74/76) to penetrate to a depth below the top-most surface of the raised source-regions. In this area of penetration, the gate electrode is insulated from the raised source-drain regions 60, both laterally and vertically, solely by the high-K dielectric layer 72.

Figure 21:
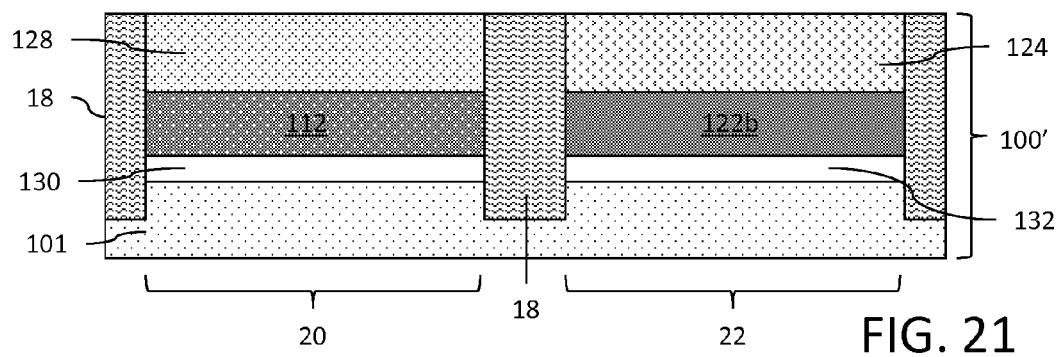
FIG. 21 illustrates a simplified representation the substrate shown in FIG. 12.

At this point, front end of line (FEOL) fabrication of the integrated circuit is complete. Further back end of line (BEOL) processing to fabricate metallizations and interconnects may then be performed as well known to those skilled in the art. Reference is now made to FIG. 21 which illustrates in a simplified representation the substrate 100' shown in FIG. 12 which supports a high mobility channel for both p-channel and n-channel transistor devices. The substrate 100' includes a substrate region 101 which presents a simplified representation of the layers/structures identified by reference numbers 100, 102a, 104a, 102b, 104b, 106, 120a and 122a in FIG. 12 (i.e., all structures in the substrate below the cavities 130 and 132). The substrate 100' further includes, above the cavities 130 and 132, the layers 112, 122b, 124 and 128. The active areas 20 and 22 are delimited by the STI structures 18.

Reference is now made to FIGS. 22-27 which illustrate the process steps in the formation of CMOS devices with sharp junctions between the source-drain region and the high mobility channel region provided by a substrate 100' as shown in FIG. 21. It will be understood that the drawings do not necessarily show features drawn to scale.

Figure 22:
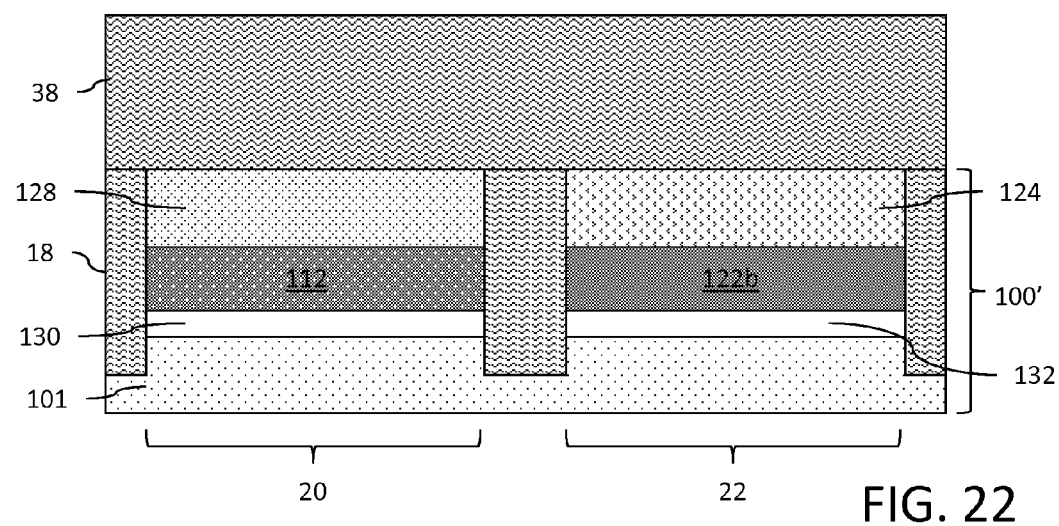
FIGS. 22-27 illustrate process steps in the formation of CMOS devices with sharp junctions between the source-drain region and the high mobility channel region provided by a substrate as shown in FIG. 21.

The process starts with the substrate 100' wafer as shown in FIG. 21. A layer 38 of dielectric material is deposited over the wafer. The layer 38 covers the epitaxial layers 124 and 128 and the STI structures 18. If the layer 38 as deposited does not have a planar top surface, a conventional chemical-mechanical polishing (CMP) technique may be used to provide a planar top surface. The layer 38 may, for example, have a thickness of 40-400 nm. The layer 38 may be deposited using a chemical vapor deposition (CVD) process. The material used for layer 38 may, for example, comprise silicon dioxide. The result is shown in FIG. 22.

Figure 23:
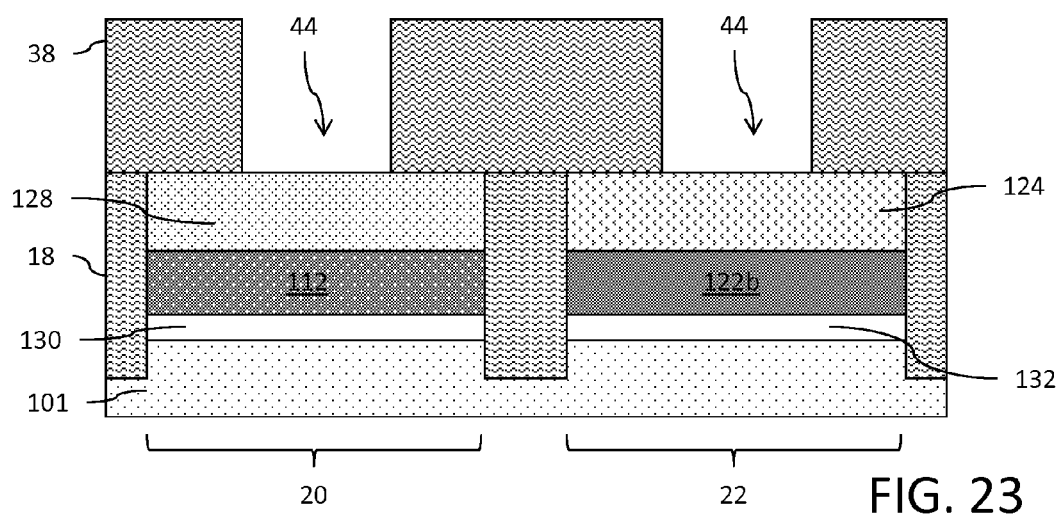

Using conventional lithographic processing techniques, an opening 44 is formed in the layer 38 at each active region. The opening 44 may, for example, be formed using a reactive ion etch (RIE). The opening 44 may have a length of 10-80 nm and a width of 10-80 nm, where length and width are used here in the same way as those terms are used in connection with a transistor structure such that the length refers to the dimension extending between the source and drain and the width refers to the dimension perpendicular thereto. The result is shown in FIG. 23.

Figure 24:
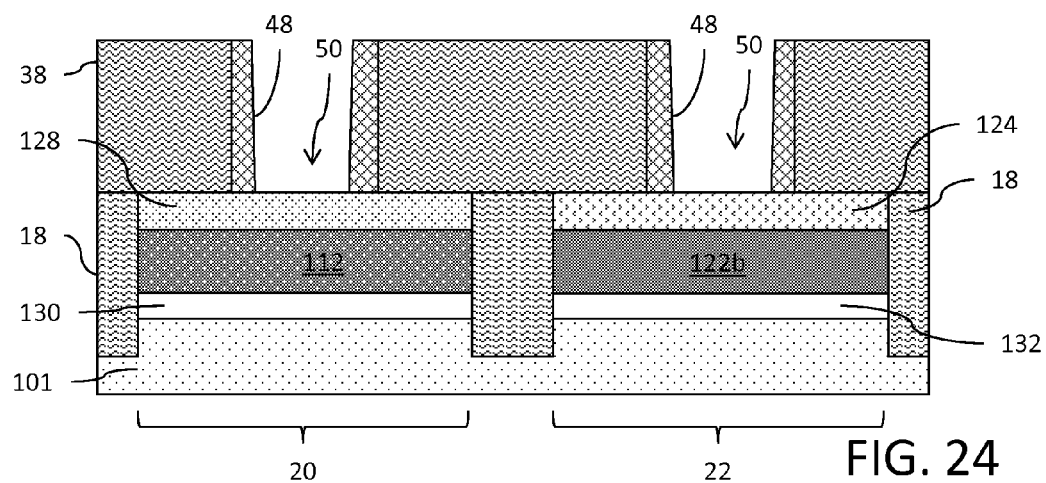

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 48 on the side walls of each opening 44. The result is shown in FIG. 24 with an opening 50 formed between opposite sidewall spacers 48. The opening 50 may, for example, have a length of 10-80 nm and a width of 10-80 nm. The low-K dielectric material may, for example, comprise SiN, SiBCN or SiOCN. The etch used to shape the sidewall spacers 48 and define opening 50 may, for example, comprise a Lam mixed mode pulsing (MMP) deposition/etch/$O_2$ flash approach.

Figure 25:
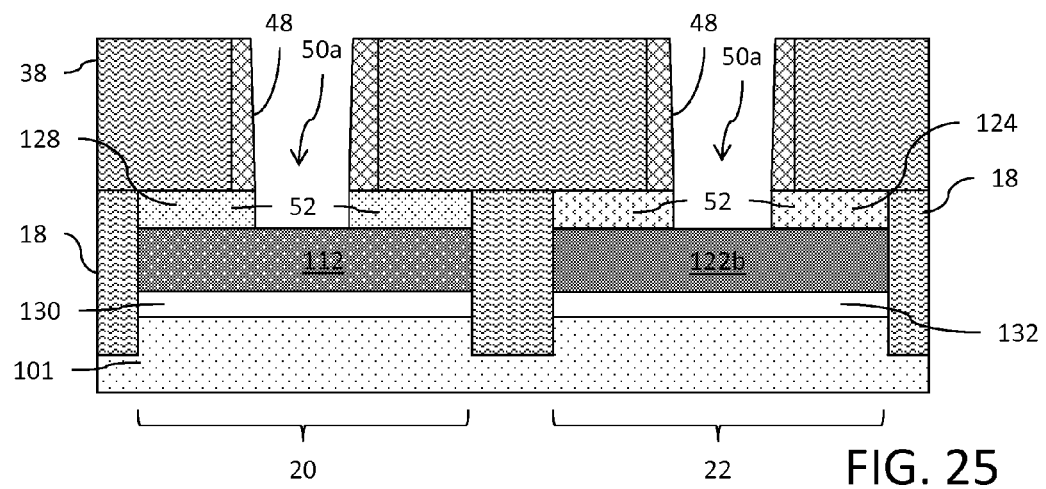

A directional etch, such as a reactive ion etch (RIE), is then performed to extend the opening 50 as opening 50a through the epitaxial layers 124 and 128 stopping on the layers 112 and 122b (such that sides of opening 50a are aligned with sides of opening 50). The result is shown in FIG. 25 to produce, from the epitaxial layers 124 and 128, a source epitaxial region on one side of the opening 50a and a drain epitaxial region on the opposite side of the opening 50a. The source and drain epitaxial regions are generally indicated at reference 52.

Figure 26:
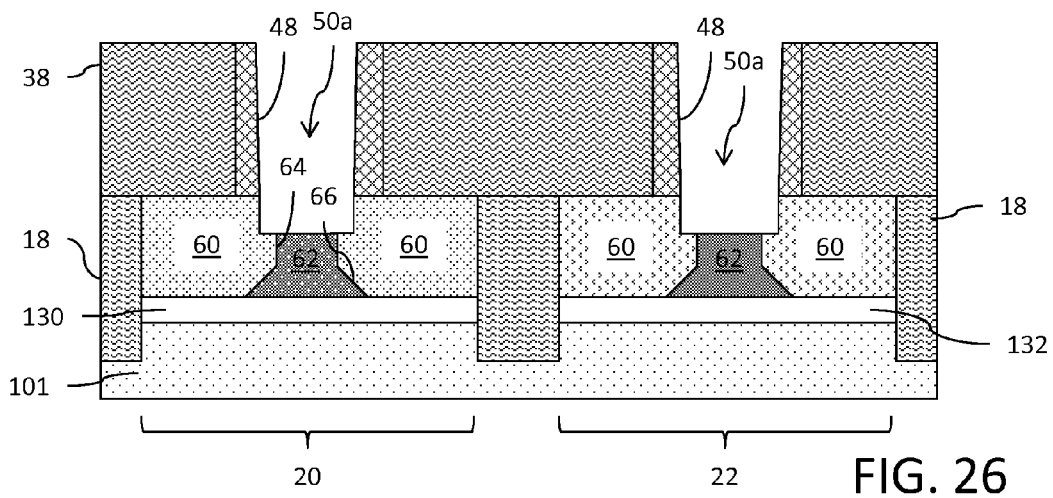

Using a laser annealing process, a recrystallization is performed to convert the source and drain epitaxial regions 52 and an underlying portion of the layers 112 and 122b into transistor source-drain regions 60. As an example, an Ultratech LXA288 may be used with an anneal temperature in a range from 800-1300° C. and a dwell time of 200-1600 µs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the semiconductor layers 16p and 16n that remain after recrystallization define channel regions 62 that are fully strained to support high mobility. The result is shown in FIG. 26. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In a preferred implementation, the portions of the layers 112 and 122b below the source and drain epitaxial regions 52 are fully converted to single crystal throughout their thickness to the cavities 130 and 132. The p-n junction with the channel region in the epitaxial layers 124 and 128 is defined by a substantially vertical junction interface portion 64 extending for a depth less than the thickness of layers 112 and 122b and a sloped junction interface portion 66 extending from the substantially vertical junction interface portion 64 in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 100'. The cavities 130 and 132 advantageously effectively prevent short channel effects and prevent current leakage when the transistor is in the off state.

Figure 27:
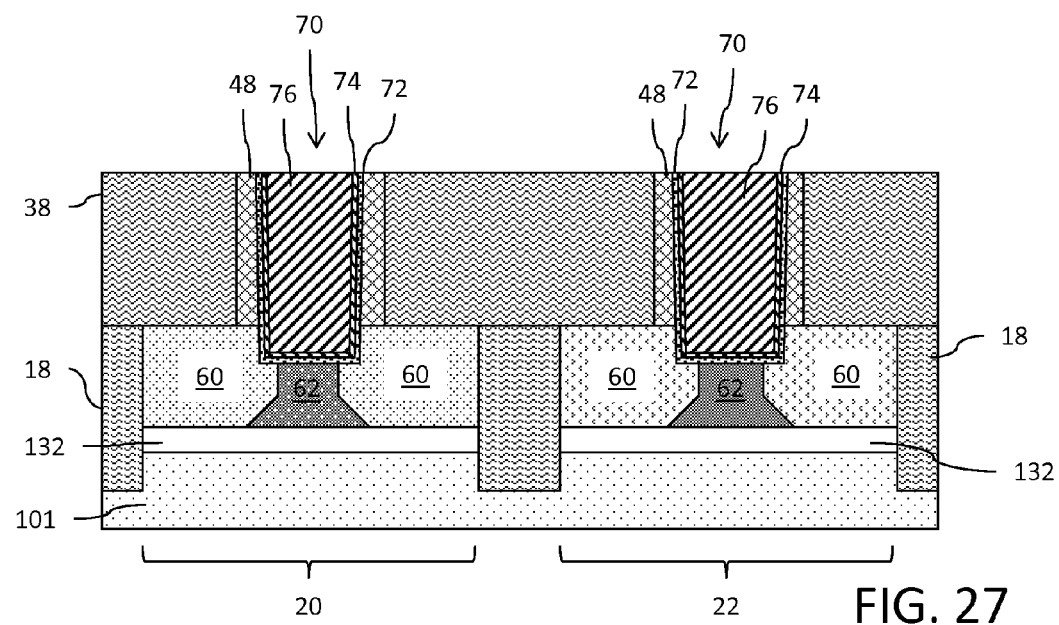

The openings 50 and 50a are then filled with a gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 27. The material for the high-K dielectric layer 72 may, for example, comprise $HfO_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that the sidewall spacer 48 sits on top of the raised source-drain regions 60. In other words, a bottom-most surface of the sidewall spacer 48 is in contact with a top-most surface of the raised source-drain regions 60. The opening 50a permits the gate electrode (defined by metal 74/76) to penetrate to a depth below the top-most surface of the raised source-regions. In this area of penetration, the gate electrode is insulated from the raised source-drain regions 60, both laterally and vertically, solely by the high-K dielectric layer 72.

At this point, front end of line (FEOL) fabrication of the integrated circuit is complete. Further back end of line (BEOL) processing to fabricate metallizations and interconnects may then be performed as well known to those skilled in the art.

Reference is now made to FIGS. 28-31 which illustrate the process steps in the formation of CMOS devices with sharp junctions between the source-drain region and the high mobility channel region provided by a substrate 100' as shown in FIG. 21. It will be understood that the drawings do not necessarily show features drawn to scale.

Figure 28:
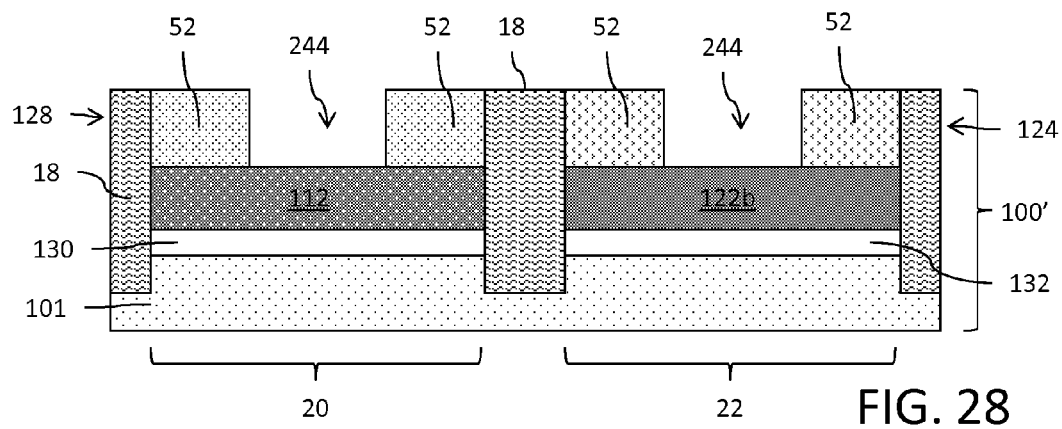
FIGS. 28-31 illustrate process steps in the formation of CMOS devices with sharp junctions between the source-drain region and the high mobility channel region provided by a substrate as shown in FIG. 21.

The process starts with the substrate 100' wafer as shown in FIG. 21. Using conventional lithographic processing techniques, an opening 244 is formed in the epitaxial layers 124 and 128 at each active region stopping on the layers 112 and 122b. The opening 244 may, for example, be formed using a reactive ion etch (RIE). The opening 244 may have a length of 10-80 nm and a width of 10-60 nm, where length and width are used here in the same way as those terms are used in connection with a transistor structure such that the length refers to the dimension extending between the source and drain and the width refers to the dimension perpendicular thereto. The result is shown in FIG. 28 to produce, from the epitaxial layers 124 and 128, a source epitaxial region on one side of the opening 244 and a drain epitaxial region on the opposite side of the opening 244. The source and drain epitaxial regions are generally indicated at reference 52.

Figure 29:
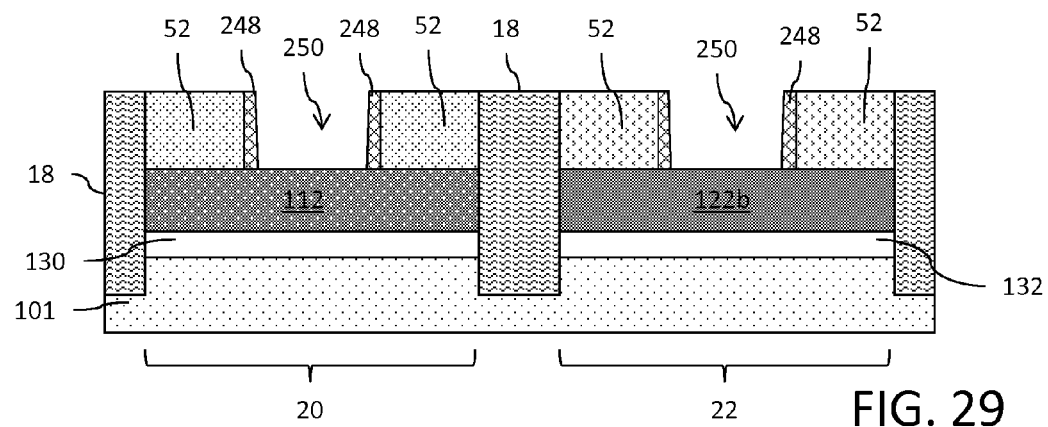

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 248 on the side walls of each opening 244. The result is shown in FIG. 29 with an opening 250 formed between opposite sidewall spacers 248. The opening 250 may, for example, have a length of 5-40 nm and a width of 5-40 nm. The low-K dielectric material may, for example, comprise SiN, SiBCN or SiOCN. The etch used to shape the sidewall spacers 248 and define opening 150 may, for example, comprise a Lam mixed mode pulsing (MMP) deposition/etch/$O_2$ flash approach.

Figure 30:
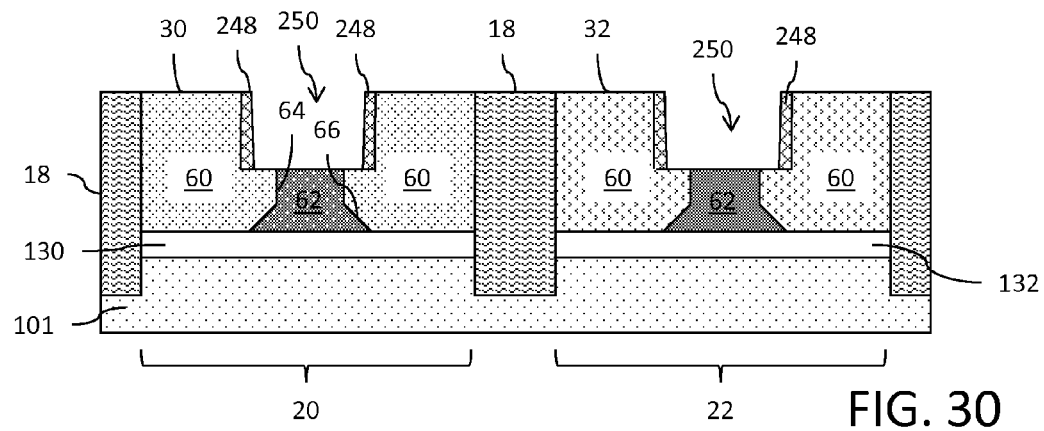

Using a laser annealing process, a recrystallization is performed to convert the source and drain epitaxial regions 52 and an underlying portion of the layers 112 and 122b into transistor source-drain regions 60. As an example, an Ultratech LXA288 may be used with an anneal temperature in a range from 800-1300° C. and a dwell time of 200-1600 μs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the layers 112 and 122b that remain after recrystallization define channel regions 62 that are fully strained to support high mobility. The result is shown in FIG. 30. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In a preferred implementation, the portions of the layers 112 and 122b below the source and drain epitaxial regions 52 are fully converted to single crystal throughout their thickness to the cavities 130 and 132. The p-n junction with the channel region in the layers 112 and 122b is defined by a substantially vertical junction interface portion 64 extending for a depth less than the thickness of layers 112 and 122b and a sloped junction interface portion 66 extending from the substantially vertical junction interface portion in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 10. The cavities 130 and 132 advantageously effectively prevent short channel effects and prevent current leakage when the transistor is in the off state.

Figure 31:
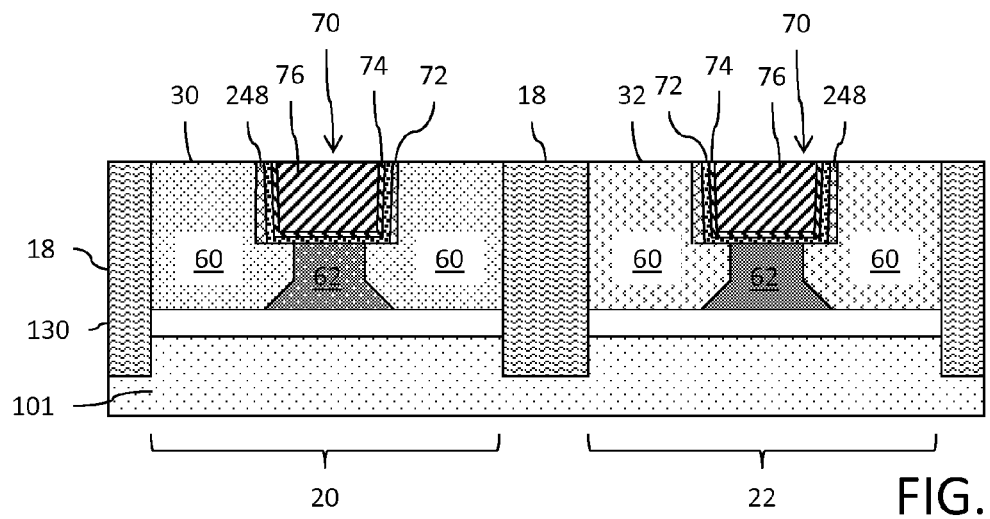

The opening 250 is then filled with the gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 31. The material for the high-K dielectric layer 72 may, for example, comprise $HfO_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that sidewall spacer 248 laterally (horizontally) separates the gate electrode (defined by metal 74/76) from the raised source-drain regions 60. In this configuration, a bottom-most surface of the sidewall spacer 248 is in contact with an intermediate surface of the source-drain regions 60 (defined by opening 250), said intermediate surface being between a top-most surface and bottom-most surface of the source-drain regions. Furthermore, with opening 250, the gate electrode is vertically separated (insulated) from the raised source-drain regions 60 at said intermediate surface by only the high-K dielectric layer 72.

At this point, front end of line (FEOL) fabrication of the integrated circuit is complete. Further back end of line (BEOL) processing to fabricate metallizations and interconnects may then be performed as well known to those skilled in the art.

The process of FIGS. 1-12 shows one method for achieving a substrate 100' having a stress-released layers 112 and 122b surmounted by epitaxial layers 124 and 128 with underlying cavities 130 and 132 for supporting PMOS and NMOS transistor fabrication of CMOS circuitry. The transistor circuit fabrication processes of FIGS. 13-20, FIGS. 22-27 and FIGS. 28-31 may be implemented using any suitably formed substrate 100' made using the process of FIGS. 1-12 or using some other process.

Reference is now made to FIGS. 32-39 which illustrate the process steps in the formation of CMOS devices with sharp junctions between the source-drain region and the channel region. It will be understood that the drawings do not necessarily show features drawn to scale.

Figure 32:
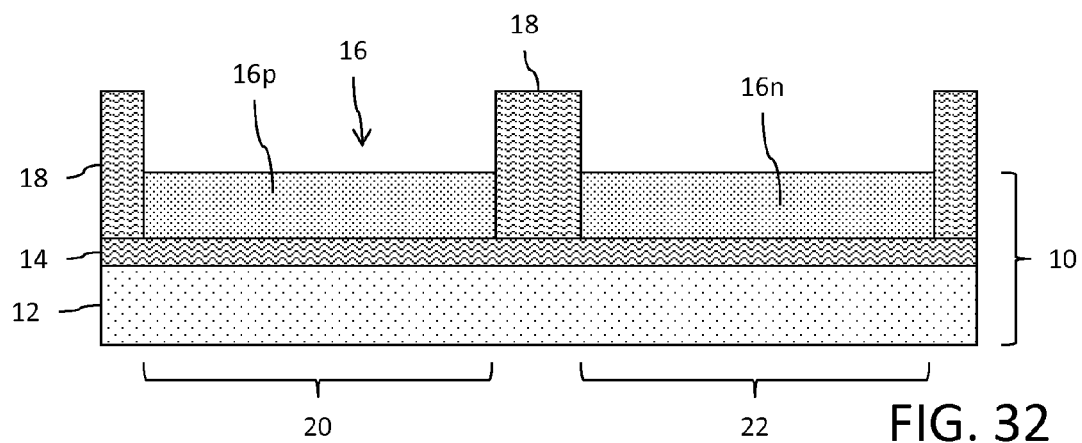
FIGS. 32-39 illustrate process steps in the formation of CMOS devices with sharp junctions between the source-drain region and the channel region.

FIG. 32 shows a silicon on insulator (SOI) semiconductor substrate 10 comprising a semiconductor substrate 12, an insulating layer 14 and a semiconductor layer 16 in a stack of a wafer. The semiconductor layer 16 may, for example, have a thickness of 10-100 nm. The insulating layer 14 is commonly referred to in the art as a buried oxide (BOX) layer. The semiconductor layer 16 is strained as needed for high mobility performance (for example, in accordance with the technique described above in connection with FIGS. 1-12 to provide layers 112 and 122b). Shallow trench isolation (STI) structures 18 are provided to delimit active areas of the substrate 10. The substrate 10 includes a first active area 20 reserved for the formation of first polarity (for example, p-channel) metal oxide semiconductor devices (PMOS) and a second active area 22 reserved for the formation of second, opposite, polarity (for example, n-channel) metal oxide semiconductor devices (NMOS). The STI structures 18 may be provided to extend with an exposed height of 5-50 nm above the top surface of the semiconductor layer 16. The provision of the STI structures 18 divides the semiconductor layer 16 in accordance with the active areas to provide a semiconductor layer 16p (see, also, layer 112) for the PMOS devices and a semiconductor layer 16n (see, also, layer 122b) for the NMOS devices. In an embodiment, the semiconductor layer 16p may comprise a germanium material, a silicon material, or a silicon germanium material. The semiconductor layer 16n may comprise a silicon material. The semiconductor layers 16p and 16n may be doped as desired for the transistor application.

Figure 33:
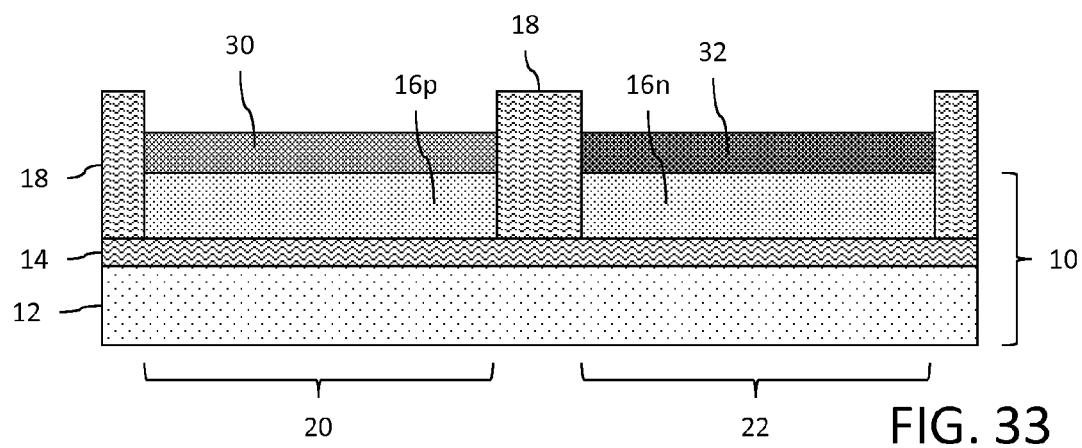

An epitaxial growth process is then performed to grow an epitaxial silicon-germanium (SiGeB) region 30 on the semiconductor layer 16p and grow an epitaxial silicon or silicon carbon region (SiP/Si:CP) 32 on the semiconductor layer 16n. The result is shown in FIG. 33. The regions 30 and 32 may, for example, have a thickness of 5-40 nm, and this thickness is preferably less than or equal to the exposed height of the STI structures 18. An in-situ Boron doped (ISBD) epitaxy may be used to form the epitaxial silicon-germanium region 30. The Boron dopant may be in the range of $1\times10^{19}$ at/cm$^3$ to $2\times10^{21}$ at/cm$^3$. Substitutional Germanium at 25% to 75% may be provided. An in-situ Phosphorous doped (ISPD) epitaxy may be used to form the epitaxial silicon or silicon-carbon region 32. The Phosphorous dopant may be in the range of $1\times10^{19}$ at/cm$^3$ to $1\times10^{21}$ at/cm$^3$. Substitutional Carbon at 0.5% to 5% may be provided.

As an alternative to strained silicon for the region 32, an epitaxial growth of indium-gallium-arsenic (InGaAs) may instead be made. The InGaAs region 32 may be doped with silicon (Si) using either an in situ process during epitaxy or an implant process after epitaxy. As an alternate to silicon dopant, any suitable Group IV (Ge or Sn) or Group VI (S, Se, Te) dopant may instead be used. In an embodiment, the dopant concentration may comprise $1\times10^{19}$ to $5\times10^{20}$ at/cm$^3$. The InGaAs/Si material may exhibit superior electron mobility in comparison to strained silicon.

Figure 34:
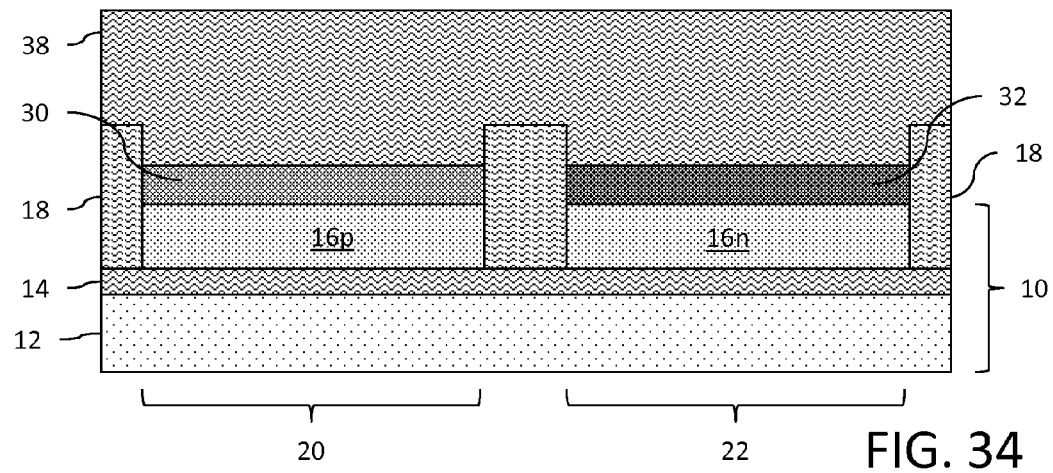
Figure 35:
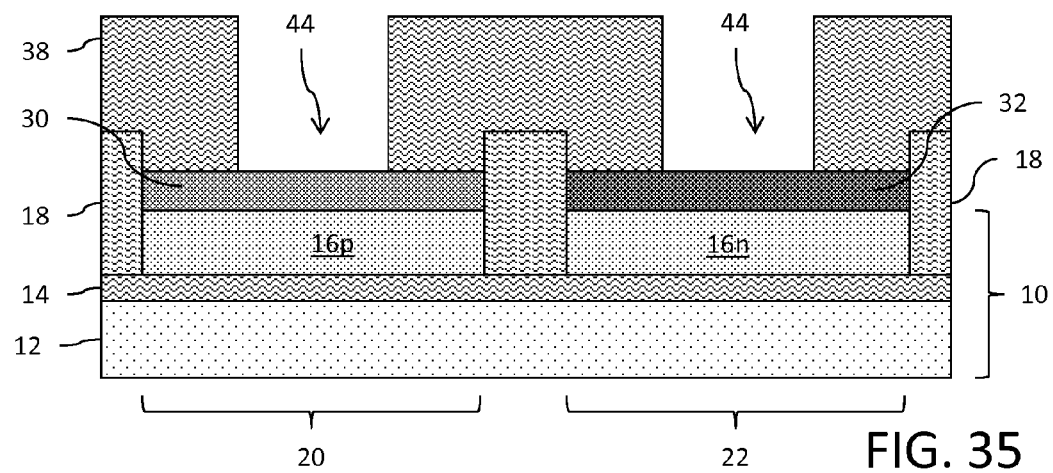

A layer 38 of dielectric material is then deposited over the wafer. The layer 38 covers the epitaxial regions 30 and 32 and the STI structures 18. If the layer 38 as deposited does not have a planar top surface, a conventional chemical-mechanical polishing (CMP) technique may be used to provide a planar top surface. The layer 38 may, for example, have a thickness of 40-400 nm. The layer 38 may be deposited using a chemical vapor deposition (CVD) process. The material used for layer 38 may, for example, comprise silicon dioxide. The result is shown in FIG. 34.

Using conventional lithographic processing techniques, an opening 44 is formed in the layer 38 at each active region. The opening 44 may, for example, be formed using a reactive ion etch (RIE). The opening 44 may have a length of 10-80 nm and a width of 10-80 nm, where length and width are used here in the same way as those terms are used in connection with a transistor structure such that the length refers to the dimension extending between the source and drain and the width refers to the dimension perpendicular thereto. The result is shown in FIG. 4.

Figure 36:
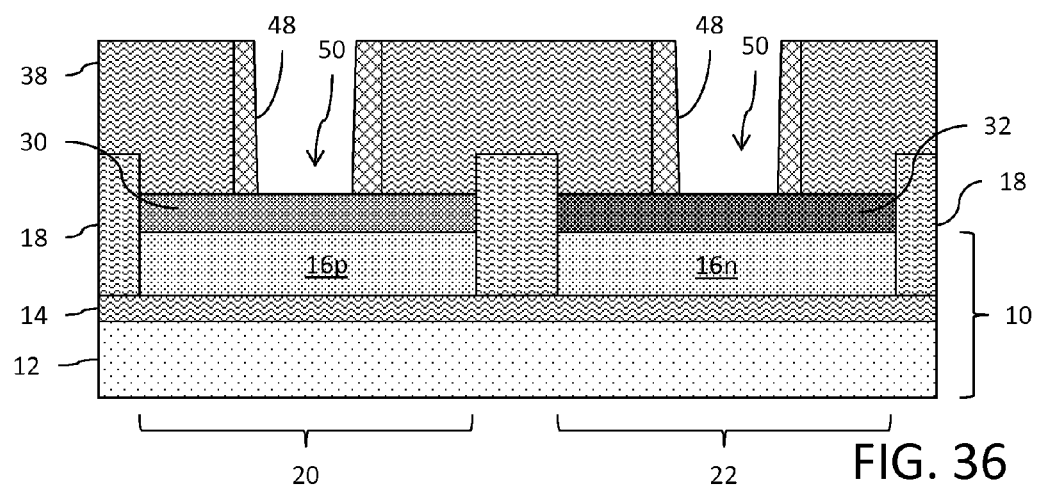

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 48 on the side walls of each opening 44. The result is shown in FIG. 36 with an opening 50 formed between opposite sidewall spacers 48. The opening 50 may, for example, have a length of 10-80 nm and a width of 10-80 nm. The low-K dielectric material may, for example, comprise SiN, SiBCN or SiOCN. The etch used to shape the sidewall spacers 48 and define opening 50 may, for example, comprise a Lam mixed mode pulsing (MMP) deposition/etch/O$_2$ flash approach.

Figure 37:
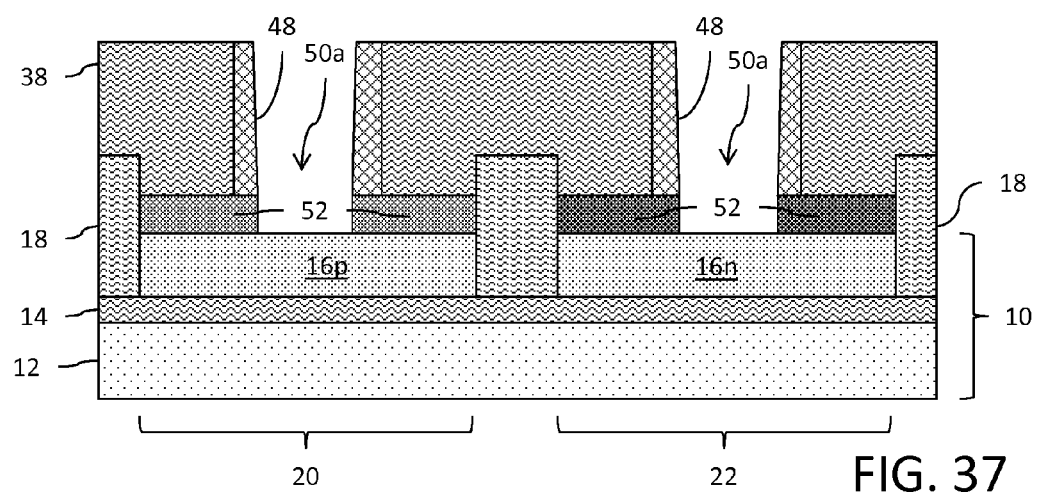

A directional etch, such as a reactive ion etch (RIE), is then performed to extend the opening 50 as opening 50a through the epitaxial regions 30 and 32 stopping on the semiconductor layers 16p and 16n (such that sides of opening 50a are aligned with sides of opening 50). The result is shown in FIG. 37 to produce, from the epitaxial regions 30 and 32, a source epitaxial region on one side of the opening 50a and a drain epitaxial region on the opposite side of the opening 50a. The source and drain epitaxial regions are generally indicated at reference 52.

Figure 38:
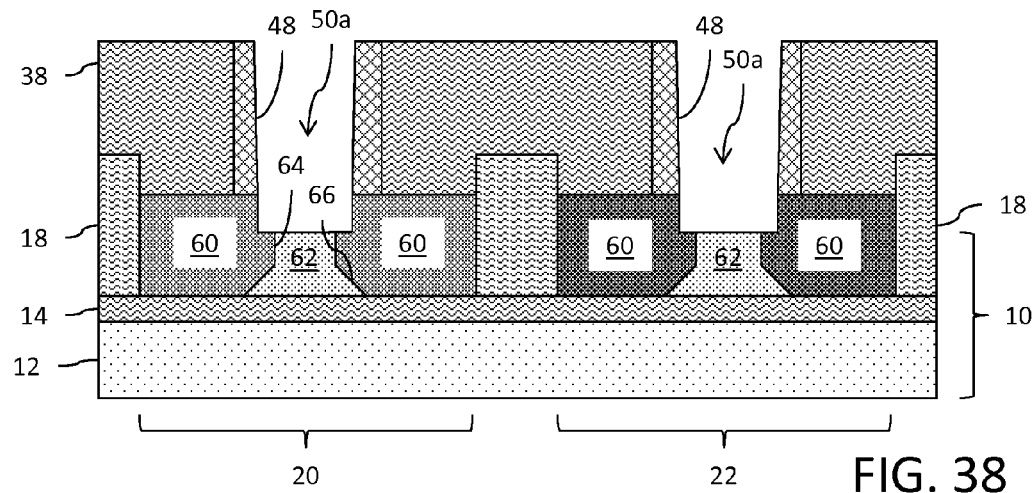

Using a laser annealing process, a recrystallization is performed to convert the source and drain epitaxial regions 52 and an underlying portion of the semiconductor layers 16p and 16n into transistor source-drain regions 60. As an example, an Ultratech LXA288 may be used with an anneal temperature in a range from 800-1300° C. and a dwell time of 200-1600 μs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the semiconductor layers 16p and 16n that remain after recrystallization define channel regions 62. The result is shown in FIG. 38. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In a preferred implementation, the portions of the semiconductor layers 16p and 16n below the epitaxial regions 30 and 32 are fully converted to single crystal throughout their thickness to the upper surface of the insulating layer 14. The p-n junction with the channel region in the semiconductor layers 16p and 16n is defined by a substantially vertical junction interface portion 64 extending for a depth less than the layer 16 thickness and a sloped junction interface portion 66 extending from the substantially vertical junction interface portion 64 in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 10.

Figure 39:
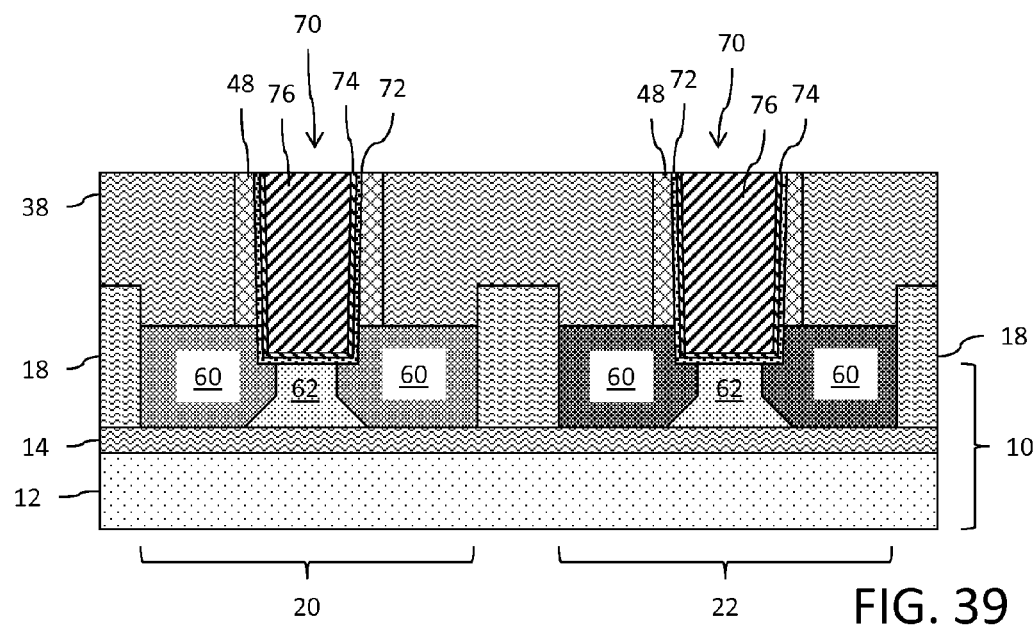

The openings 50 and 50a are then filled with the gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 39. The material for the high-K dielectric layer 72 may, for example, comprise $HfO_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that the sidewall spacer 48 sits on top of the raised source-drain regions 60. In other words, a bottom-most surface of the sidewall spacer 48 is in contact with a top-most surface of the raised source-drain regions 60. The opening 50a permits the gate electrode (defined by metal 74/76) to penetrate to a depth below the top-most surface of the raised source-regions. In this area of penetration, the gate electrode is insulated from the raised source-drain regions 60, both laterally and vertically, solely by the high-K dielectric layer 72.

In an embodiment, the insulating layer 14 may be selectively removed to produce cavities (like the cavities 130 and 132 discussed above) under the regions 16p and 16n.

At this point, front end of line (FEOL) fabrication of the integrated circuit is complete. Further back end of line (BEOL) processing to fabricate metallizations and interconnects may then be performed as well known to those skilled in the art.

The CMOS transistor circuits shown in FIGS. 27 and 39 present a number of advantages including: a) a single inner spacer for both the PMOS and the NMOS with relatively large gate metal contact area; b) a low resistance extension with the thick epitaxial regions; c) a fully strained channel with high carrier mobility; d) formation of the raised source-drain regions before gate patterning provide uniform raised source-drain across various different pitches and simplifies dual epitaxial integration; and e) good control of channel thickness with respect to the SOI substrate (which can be of the extremely thin silicon on insulator (ETSOI) or ultra-thin body and BOX (UTBB) type known in the art).

Reference is now made to FIGS. 40-49 which illustrate the process steps in the formation of CMOS devices with sharp junctions between the source-drain region and the channel region. It will be understood that the drawings do not necessarily show features drawn to scale.

Figure 40:
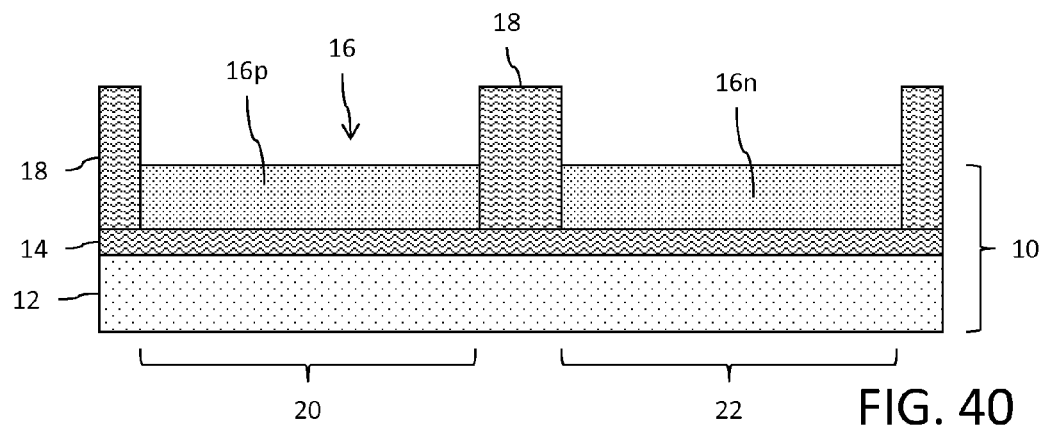
FIGS. 40-49 illustrate process steps in the formation of CMOS devices with sharp junctions between the source-drain region and the channel region.

FIG. 40 shows a silicon on insulator (SOI) semiconductor substrate 10 comprising a semiconductor substrate 12, an insulating layer 14 and a semiconductor layer 16 in a stack of a wafer. The semiconductor layer 16 may, for example, have a thickness of 10-100 nm. The insulating layer 14 is commonly referred to in the art as a buried oxide (BOX) layer. The semiconductor layer 16 is strained as needed for high mobility performance (for example, in accordance with the technique described above in connection with FIGS. 1-12 to provide layers 112 and 122b). Shallow trench isolation (STI) structures 18 are provided to delimit active areas of the substrate 10. The substrate 10 includes a first active area 20 reserved for the formation of first polarity (for example, p-channel) metal oxide semiconductor devices (PMOS) and a second active area 22 reserved for the formation of second, opposite, polarity (for example, n-channel) metal oxide semiconductor devices (NMOS). The STI structures 18 may be provided to extend with an exposed height of 5-50 nm above the top surface of the semiconductor layer 16. The provision of the STI structures 18 divides the semiconductor layer 16 in accordance with the active areas to provide a semiconductor layer 16p (see, also, layer 112) for the PMOS devices and a semiconductor layer 16n (see, also, layer 122b) for the NMOS devices. In an embodiment, the semiconductor layer 16p may comprise a germanium material, a silicon material, or a silicon germanium material. The semiconductor layer 16n may comprise a silicon material. The semiconductor layers 16p and 16n may be doped as desired for the transistor application.

Figure 41:
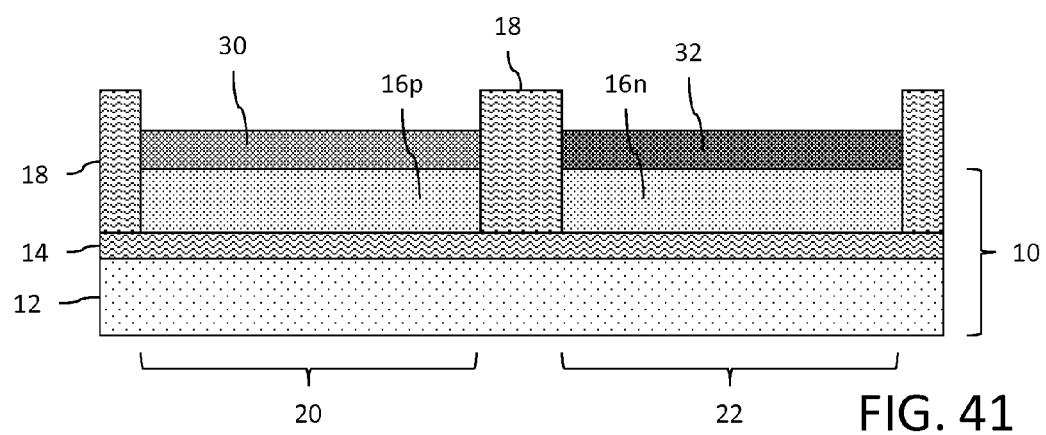

An epitaxial growth process is then performed to grow an epitaxial silicon-germanium (SiGeB) region 30 on the semiconductor layer 16p and grow an epitaxial silicon or silicon carbon region (SiP/Si:CP) 32 on the semiconductor layer 16n. The result is shown in FIG. 41. The regions 30 and 32 may, for example, have a thickness of 5-40 nm, and this thickness is preferably less than or equal to the exposed height of the STI structures 18. An in-situ Boron doped (ISBD) epitaxy may be used to form the epitaxial silicon-germanium region 30. The Boron dopant may be in the range of $1\times10^{19}$ at/cm$^3$ to $2\times10^{21}$ at/cm$^3$. Substitutional Germanium at 25% to 75% may be provided. An in-situ Phosphorous doped (ISPD) epitaxy may be used to form the epitaxial silicon or silicon-carbon region 32. The Phosphorous dopant may be in the range of $1\times10^{19}$ at/cm$^3$ to $1\times10^{21}$ at/cm$^3$. Substitutional Carbon at 0.5% to 5% may be provided.

As an alternative to strained silicon for the region 32, an epitaxial growth of indium-gallium-arsenic (InGaAs) may instead be made. The InGaAs region 32 may be doped with silicon (Si) using either an in situ process during epitaxy or an implant process after epitaxy. As an alternate to silicon dopant, any suitable Group IV (Ge or Sn) or Group VI (S, Se, Te) dopant may instead be used. In an embodiment, the dopant concentration may comprise $1\times10^{19}$ to $5\times10^{20}$ at/cm$^3$. The InGaAs/Si material may exhibit superior electron mobility in comparison to strained silicon.

Figure 42:
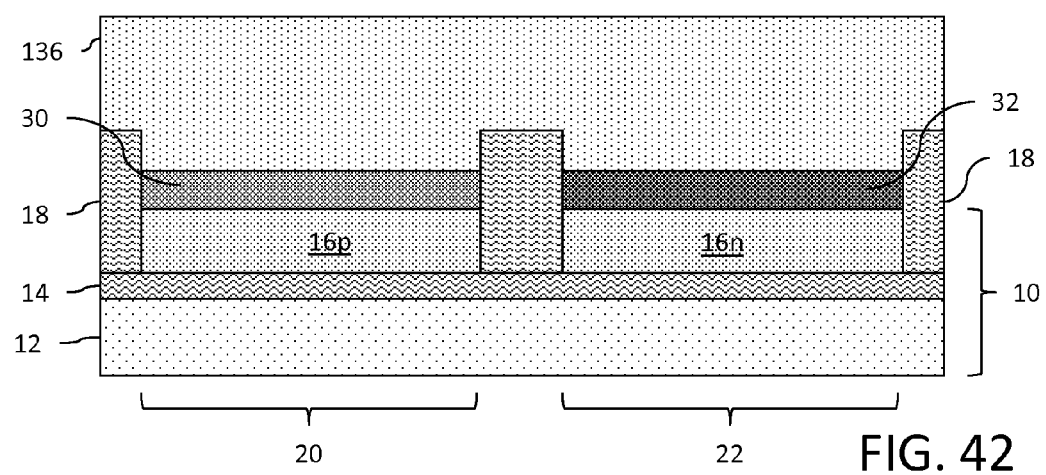

A layer 136 of sacrificial material is then deposited over the wafer. The layer 136 covers the epitaxial regions 30 and 32 and the STI structures 18. If the layer 136 as deposited does not have a planar top surface, a conventional chemical-mechanical polishing (CMP) technique may be used to provide a planar top surface. The layer 136 may, for example, have a thickness of 40-400 nm. The layer 136 may be deposited using a chemical vapor deposition (CVD) process. The material used for layer 136 may, for example, comprise doped or undoped polysilicon. The result is shown in FIG. 42.

Figure 43:
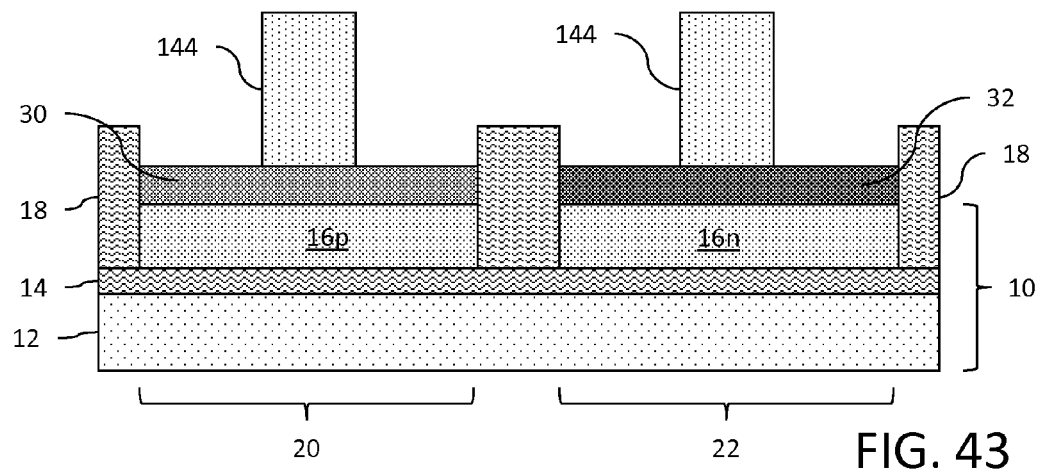

Using conventional lithographic processing techniques, the layer 136 is patterned to define a dummy gate 144 at each active region. The dummy gates 144 may, for example, be formed using a reactive ion etch (RIE). The dummy gates 144 may have a length of 10-80 nm and a width of 10-80 nm, where length and width are used here in the same way as those terms are used in connection with a transistor structure such that the length refers to the dimension extending between the source and drain and the width refers to the dimension perpendicular thereto. The result is shown in FIG. 43.

Figure 44:
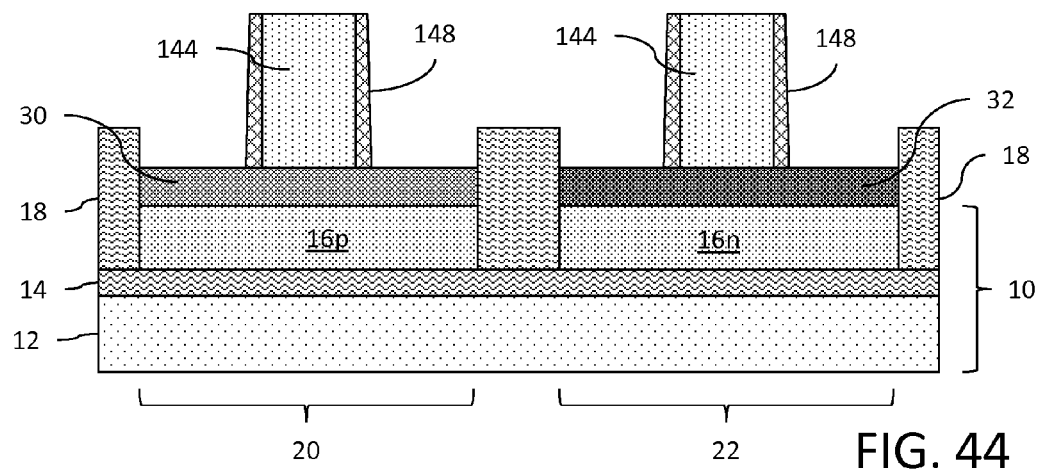

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 148 on the side walls of each dummy gate 144. The result is shown in FIG. 44. The low-K dielectric material may, for example, comprise SiN, SiBCN or SiOCN. The etch used to shape the sidewall spacers 148 may, for example, comprise a Lam mixed mode pulsing (MMP) deposition/etch/$O_2$ flash approach.

Figure 45:
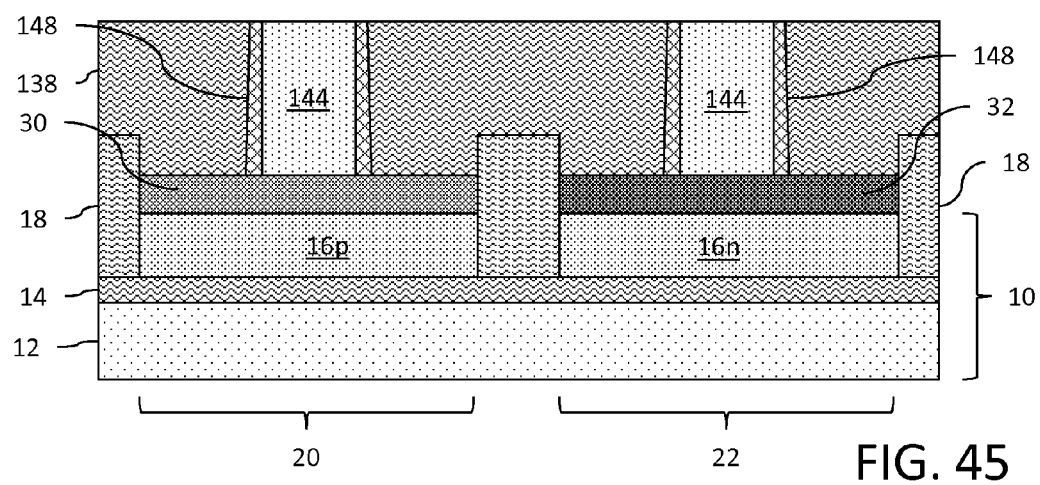

A layer 138 of dielectric material is then deposited over the wafer. The layer 138 covers the dummy gates 144, sidewall spacers 148, the epitaxial regions 30 and 32 and the STI structures 18. The layer 138 may, for example, have a thickness of 40-400 nm. The layer 138 may be deposited using a chemical vapor deposition (CVD) process. The material used for layer 38 may, for example, comprise silicon dioxide. A conventional chemical-mechanical polishing (CMP) technique is used to remove excess portions of layer 138 and provide a planar top surface coincident with the top of the dummy gate 144. The result is shown in FIG. 45.

Figure 46:
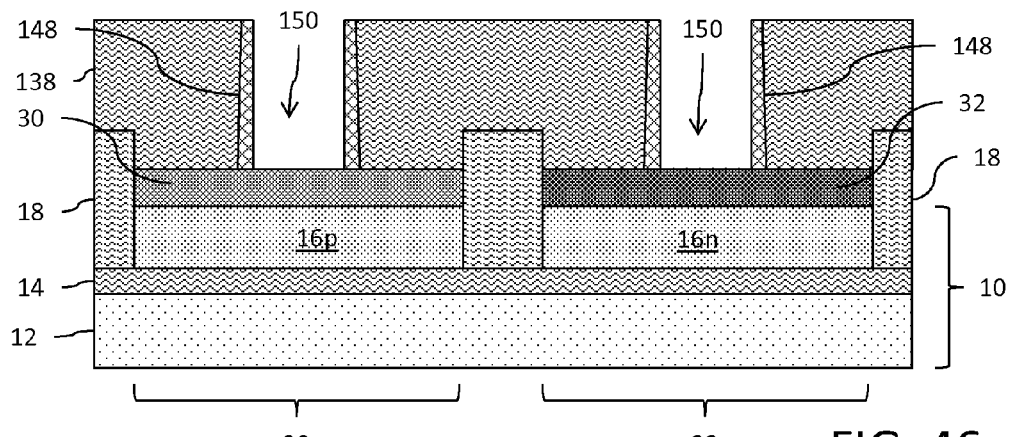

The dummy gate 144 is then selectively removed using a reactive ion etch (RIE) or wet etch or combination process to form openings 150. The result is shown in FIG. 46.

Figure 47:
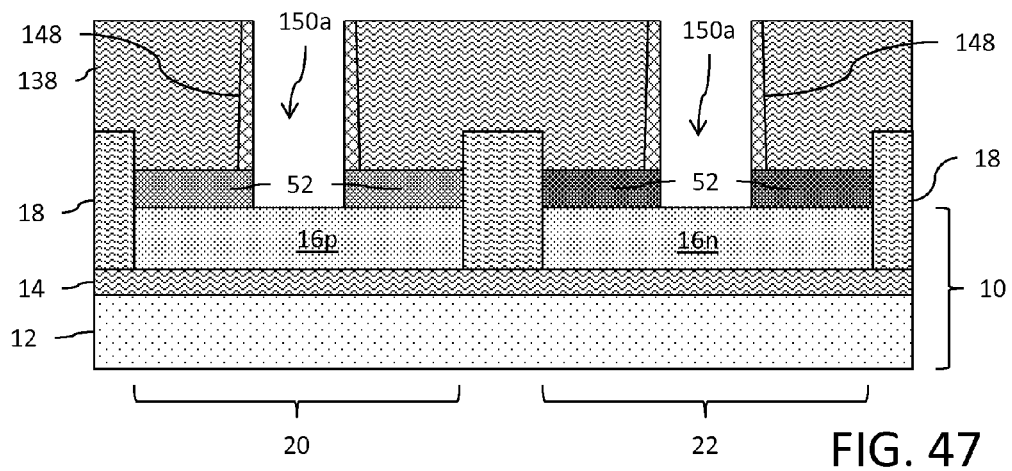

A directional etch, such as a reactive ion etch (RIE), is then performed to extend the opening 150 as opening 150a through the epitaxial regions 30 and 32 stopping on the semiconductor layers 16p and 16n (such that sides of opening 150a are aligned with sides of opening 150). The result is shown in FIG. 47 as producing, from the epitaxial regions 30 and 32, a source epitaxial region on one side of the opening 150a and a drain epitaxial region on the opposite side of the opening 150a. The source and drain epitaxial regions are generally indicated at reference 52.

Figure 48:
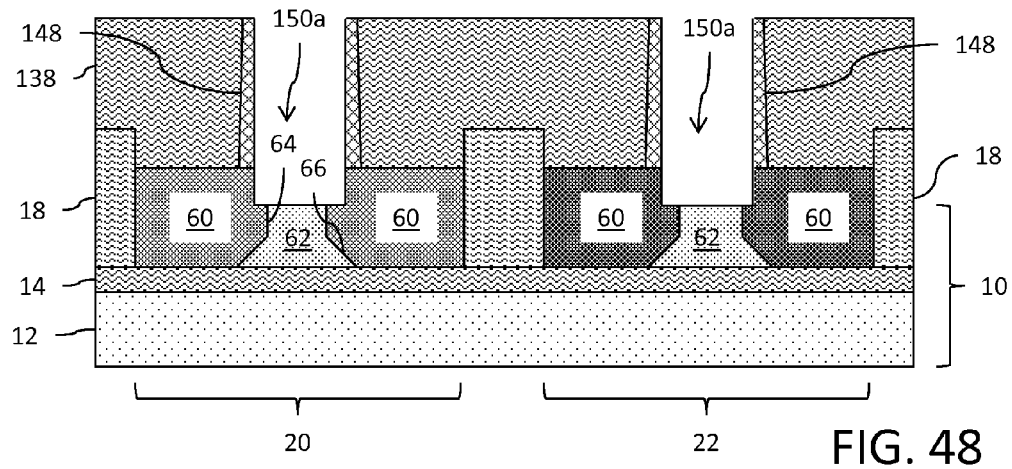

Using a laser annealing process, a recrystallization is performed to convert the source and drain epitaxial regions 52 and an underlying portion of the semiconductor layers 16p and 16n into transistor source-drain regions 60. As an example, an Ultratech LXA288 may be used with an anneal temperature in a range from 800-1300° C. and a dwell time of 200-1600 μs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the semiconductor layers 16p and 16n that remain after recrystallization define channel regions 62. The result is shown in FIG. 48. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In a preferred implementation, the portions of the semiconductor layers 16p and 16n below the epitaxial regions 30 and 32 are fully converted to single crystal throughout their thickness to the upper surface of the insulating layer 14. The p-n junction with the channel region in the semiconductor layers 16p and 16n is defined by a substantially vertical junction interface portion 64 extending for a depth less than the thickness of layer 16 and a sloped junction interface portion 66 extending from the substantially vertical junction interface portion in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 10.

Figure 49:
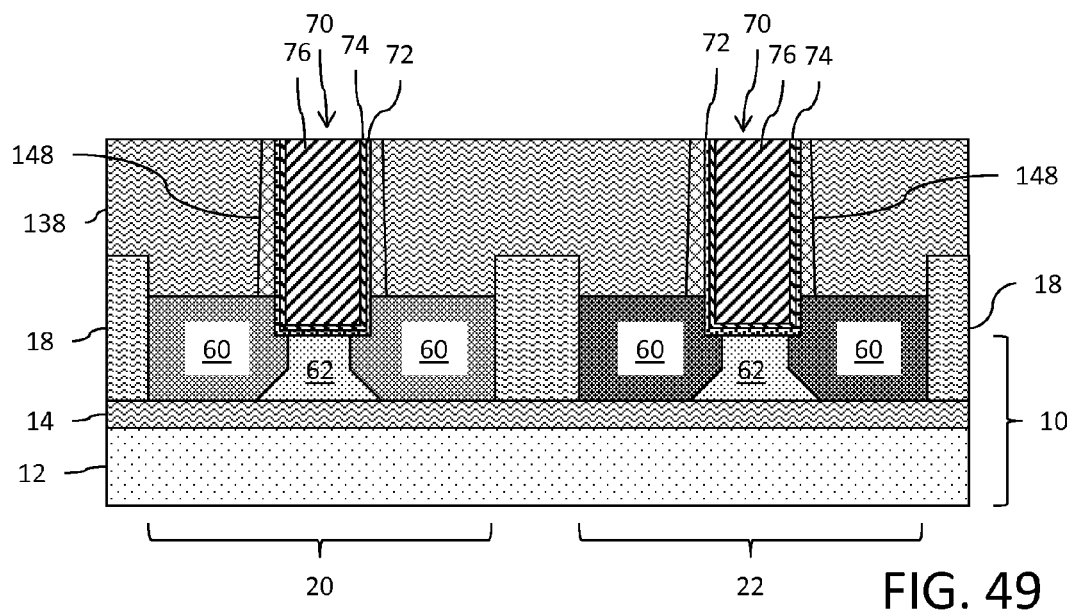

The openings 150 and 150a are then filled with the gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 49. The material for the high-K dielectric layer 72 may, for example, comprise $HfO_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that sidewall spacer 148 sits on top of the raised source-drain regions 60. In other words, a bottom-most surface of the sidewall spacer 148 is in contact with a top-most surface of the raised source-drain regions 60. The opening 150a permits the gate electrode (defined by metal 74/76) to penetrate to a depth below the top-most surface of the raised source-regions. In this area of penetration, the gate electrode is insulated from the raised source-drain regions 60, both laterally and vertically, solely by the high-K dielectric layer 72.

In an embodiment, the insulating layer 14 may be selectively removed to produce cavities (like the cavities 130 and 132 discussed above) under the regions 16p and 16n.

At this point, front end of line (FEOL) fabrication of the integrated circuit is complete. Further back end of line (BEOL) processing to fabricate metallizations and interconnects may then be performed as well known to those skilled in the art.

The CMOS transistor circuits shown in FIGS. 20 and 49 present a number of advantages including: a) a single inner spacer for both the PMOS and the NMOS with relatively large gate metal contact area; b) a low resistance extension with the thick epitaxial regions; c) a fully strained channel with high carrier mobility; d) formation of the raised source-drain regions before gate patterning provide uniform raised source-drain across various different pitches and simplifies dual epitaxial integration; and e) good control of channel thickness with respect to the SOI substrate (which can be of the extremely thin silicon on insulator (ETSOI) or ultra-thin body and BOX (UTBB) type known in the art).

Reference is now made to FIGS. 50-55 which illustrate the process steps in the formation of CMOS devices with sharp junctions between the source-drain region and the channel region. It will be understood that the drawings do not necessarily show features drawn to scale.

Figure 50:
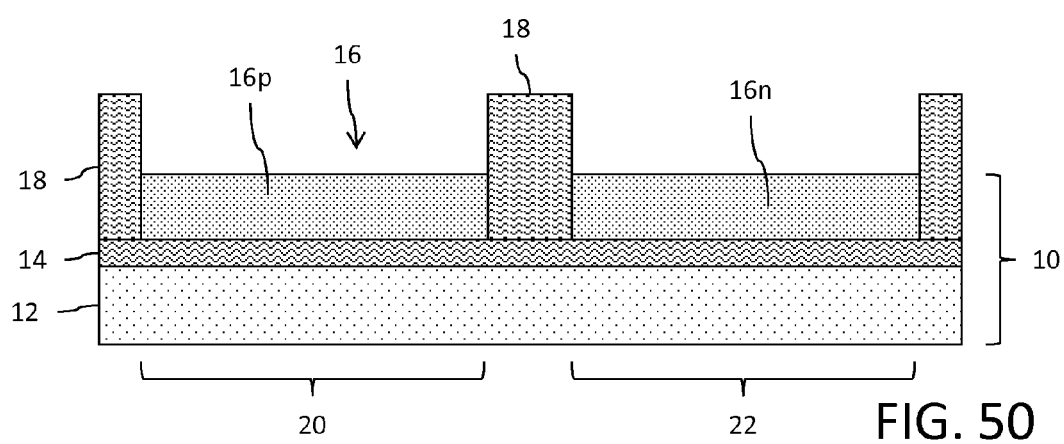
FIGS. 50-55 illustrate process steps in the formation of CMOS devices with sharp junctions between the source-drain region and the channel region.

FIG. 50 shows a silicon on insulator (SOI) semiconductor substrate 10 comprising a semiconductor substrate 12, an insulating layer 14 and a semiconductor layer 16 in a stack of a wafer. The semiconductor layer 16 may, for example, have a thickness of 10-100 nm. The insulating layer 14 is commonly referred to in the art as a buried oxide (BOX) layer. The semiconductor layer 16 is strained as needed for high mobility performance (for example, in accordance with the technique described above in connection with FIGS. 1-12 to provide layers 112 and 122b). Shallow trench isolation (STI) structures 18 are provided to delimit active areas of the substrate 10. The substrate 10 includes a first active area 20 reserved for the formation of first polarity (for example, p-channel) metal oxide semiconductor devices (PMOS) and a second active area 22 reserved for the formation of second, opposite, polarity (for example, n-channel) metal oxide semiconductor devices (NMOS). The STI structures 18 may be provided to extend with an exposed height of 5-50 nm above the top surface of the semiconductor layer 16. The provision of the STI structures 18 divides the semiconductor layer 16 in accordance with the active areas to provide a semiconductor layer 16p (see, also, layer 112) for the PMOS devices and a semiconductor layer 16n (see, also, layer 122b) for the NMOS devices. In an embodiment, the semiconductor layer 16p may comprise a germanium material, a silicon material, or a silicon germanium material. The semiconductor layer 16n may comprise a silicon material. The semiconductor layers 16p and 16n may be doped as desired for the transistor application.

Figure 51:
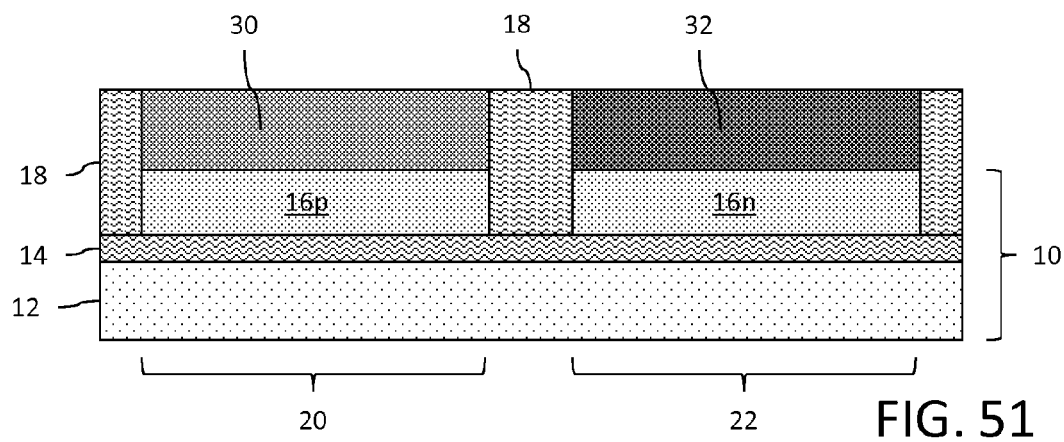

An epitaxial growth process is then performed to grow an epitaxial silicon-germanium (SiGeB) region 30 on the semiconductor layer 16p and grow an epitaxial silicon or silicon carbon region (SiP/Si:CP) 32 on the semiconductor layer 16n. The result is shown in FIG. 51. The regions 30 and 32 may, for example, have a thickness of 5-40 nm, and this thickness is preferably less than or equal to the exposed height of the STI structures 18. An in-situ Boron doped (ISBD) epitaxy may be used to form the epitaxial silicon-germanium region 30. The Boron dopant may be in the range of $1 \times 10^{19}$ at/cm$^3$ to $2 \times 10^{21}$ at/cm$^3$. Substitutional Germanium at 25% to 75% may be provided. An in-situ Phosphorous doped (ISPD) epitaxy may be used to form the epitaxial silicon or silicon-carbon region 32. The Phosphorous dopant may be in the range of $1 \times 10^{19}$ at/cm$^3$ to $1 \times 10^{21}$ at/cm$^3$. Substitutional Carbon at 0.5% to 5% may be provided.

As an alternative to strained silicon for the region 32, an epitaxial growth of indium-gallium-arsenic (InGaAs) may instead be made. The InGaAs region 32 may be doped with silicon (Si) using either an in situ process during epitaxy or an implant process after epitaxy. As an alternate to silicon dopant, any suitable Group IV (Ge or Sn) or Group VI (S, Se, Te) dopant may instead be used. In an embodiment, the dopant concentration may comprise $1 \times 10^{19}$ to $5 \times 10^{20}$ at/cm$^3$. The InGaAs/Si material may exhibit superior electron mobility in comparison to strained silicon.

Figure 52:
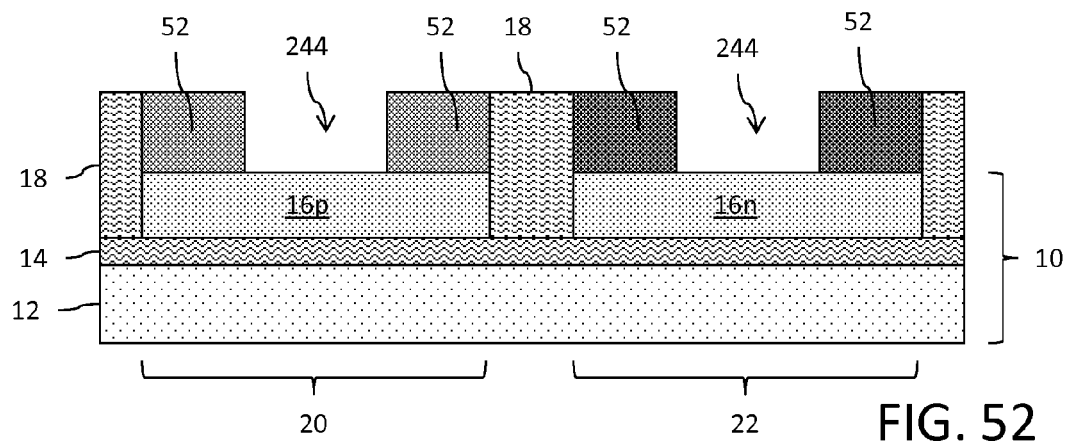

Using conventional lithographic processing techniques, an opening 244 is formed in the epitaxial regions 30/32 at each active region stopping at the semiconductor layer 16. The opening 244 may, for example, be formed using a reactive ion etch (RIE). The opening 244 may have a length of 10-80 nm and a width of 10-60 nm, where length and width are used here in the same way as those terms are used in connection with a transistor structure such that the length refers to the dimension extending between the source and drain and the width refers to the dimension perpendicular thereto. The result is shown in FIG. 52 as producing, from the epitaxial regions 30 and 32, a source epitaxial region on one side of the opening 244 and a drain epitaxial region on the opposite side of the opening 244. The source and drain epitaxial regions are generally indicated at reference 52.

Figure 53:
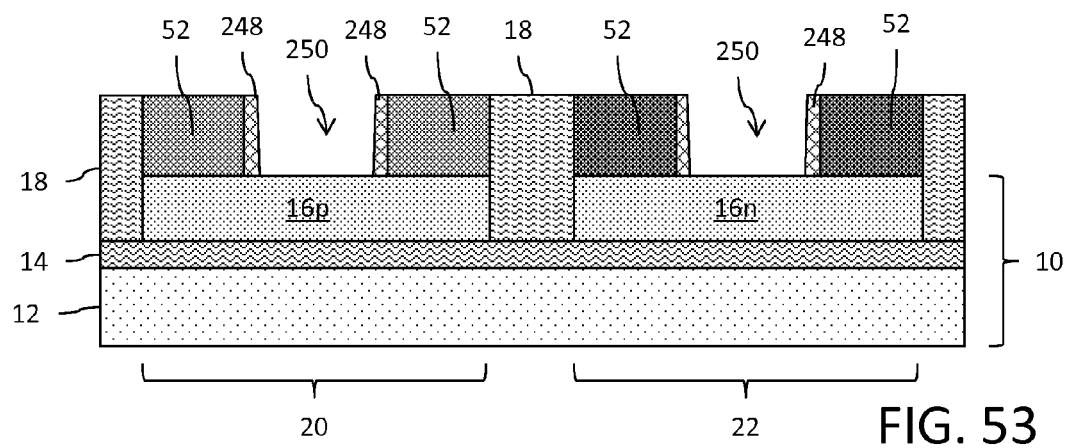

A conformal deposit of a layer of a low-K dielectric material is then made using an atomic layer deposition technique. The layer may have a thickness of approximately 2-20 nm. A directional etch, such as a reactive ion etch (RIE), is then performed to remove material from the horizontal surfaces and define a sidewall spacer 248 on the side walls of each opening 244. The result is shown in FIG. 53 with an opening 250 formed between opposite sidewall spacers 248. The opening 250 may, for example, have a length of 5-40 nm and a width of 5-40 nm. The low-K dielectric material may, for example, comprise SiN, SiBCN or SiOCN. The etch used to shape the sidewall spacers 248 and define opening 150 may, for example, comprise a Lam mixed mode pulsing (MMP) deposition/etch/O$_2$ flash approach.

Figure 54:
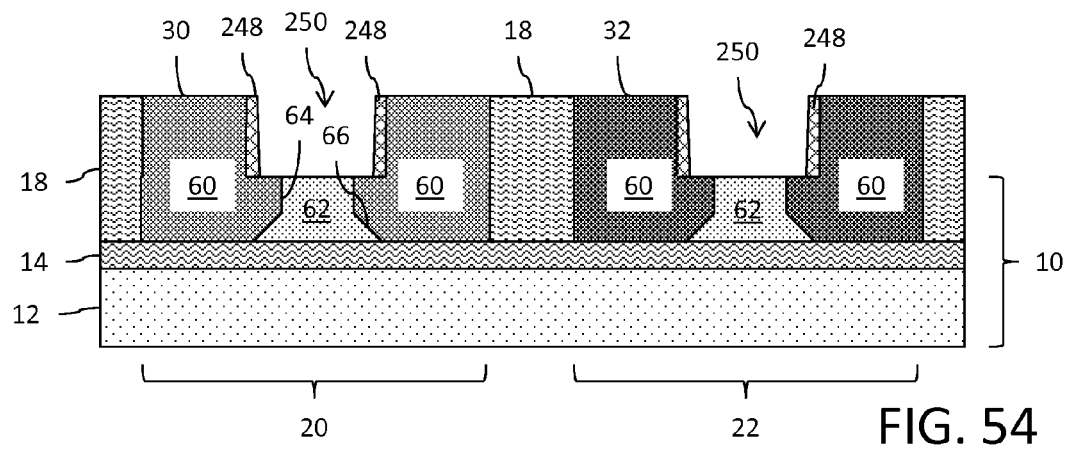

Using a laser annealing process, a recrystallization is performed to convert the source and drain epitaxial regions 52 and an underlying portion of the semiconductor layers 16p and 16n into transistor source-drain regions 60. As an example, an Ultratech LXA288 may be used with an anneal temperature in a range from 800-1300° C. and a dwell time of 200-1600 μs. The laser annealing process advantageously allows for a uniform distribution of dopant within the junction, exceeding the rapid thermal processing (RTP) solubility limit and decreasing electrical resistance in the junctions by an order of magnitude. The laser annealing process functionally converts amorphous or polycrystalline material formed by previous dopant implants or epitaxial doping into single crystal material. The portions of the semiconductor layers 16p and 16n that remain after recrystallization define channel regions 62. The result is shown in FIG. 54. The channel region may, for example, have a length of 1-20 nm extending between the locations of sharply defined junctions with the source-drain regions 60. The sharply defined junctions are obtained by controlling both the epitaxial layer thickness and dopant concentration as well as the temperature and dwell time of the anneal. The junction will exhibit a greatly reduced junction electrical resistance with better control over the local dopant diffusion profile than with RTP.

In an preferred implementation, the portions of the semiconductor layers 16p and 16n below the epitaxial regions 30 and 32 are fully converted to single crystal throughout their thickness to the upper surface of the insulating layer 14. The p-n junction with the channel region in the semiconductor layers 16p and 16n is defined by a substantially vertical junction interface portion 64 extending for a depth less than the layer 16 thickness and a sloped junction interface portion 66 extending from the substantially vertical junction interface portion in a direction away from the channel region 62. In this context, the junction interface portion 64 is substantially vertical in that a straight line connecting ends of the junction interface portion 64 forms an angle of less than 5° with respect to a straight line extending perpendicular to a rear surface of the substrate 10.

Figure 55:
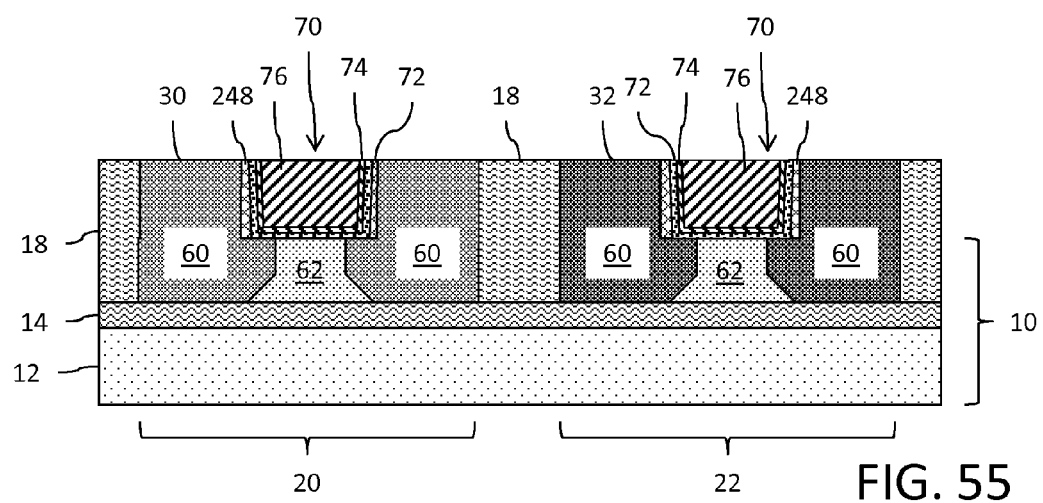

The opening 250 is then filled with the gate stack 70 comprising a high-K dielectric layer 72, a metal liner 74 and a metal fill 76. A conventional chemical-mechanical polishing (CMP) technique is used to eliminate excess material and provide a planar top surface. The result is shown in FIG. 55. The material for the high-K dielectric layer 72 may, for example, comprise HfO$_2$ deposited using atomic layer deposition (ALD) with a thickness of 1-10 nm. The material for the metal liner 74 may, for example, comprise TiN deposited using atomic layer deposition (ALD) with a thickness of 2-6 nm. The material for the metal fill 76 may, for example, comprise Tungsten deposited using chemical vapor deposition (CVD) with a thickness of 100-200 nm.

From a structural perspective, it will be noted that sidewall spacer 248 laterally (horizontally) separates the gate electrode (defined by metal 74/76) from the raised source-drain regions 60. In this configuration, a bottom-most surface of the sidewall spacer 248 is in contact with an intermediate surface of the source-drain regions 60 (defined by opening 250), said intermediate surface being between a top-most surface and bottom-most surface of the source-drain regions. Furthermore, with opening 250, the gate electrode is vertically separated (insulated) from the raised source-drain regions 60 at said intermediate surface by only the high-K dielectric layer 72.

In an embodiment, the insulating layer 14 may be selectively removed to produce cavities (like the cavities 130 and 132 discussed above) under the regions 16p and 16n.

At this point, front end of line (FEOL) fabrication of the integrated circuit is complete. Further back end of line (BEOL) processing to fabricate metallizations and interconnects may then be performed as well known to those skilled in the art.

The CMOS transistor circuits shown in FIGS. 31 and 55 present a number of advantages including: a) a single inner spacer for both the PMOS and the NMOS with relatively large gate metal contact area; b) a low resistance extension with the thick epitaxial regions; c) a fully strained channel with high carrier mobility; d) formation of the raised source-drain regions before gate patterning provide uniform raised source-drain across various different pitches and simplifies dual epitaxial integration; and e) good control of channel thickness with respect to the SOI substrate (which can be of the extremely thin silicon on insulator (ETSOI) or ultra-thin body and BOX (UTBB) type known in the art).

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    forming a support structure including an insulating layer;
    forming a semiconductor layer over the insulating layer;
    removing at least a portion of the insulating layer to form a cavity under the semiconductor layer;
    growing an epitaxial layer of semiconductor material on said semiconductor layer;
    forming an opening extending through said epitaxial layer of semiconductor material at a position where a transistor gate is to be located to provide, from said epitaxial layer of semiconductor material, a source epitaxial region on one side of said opening and a drain epitaxial region on an opposite side of said opening;
    after forming said cavity and said opening:
        applying an anneal temperature to both the source epitaxial region and a first portion of the semiconductor layer underlying the source epitaxial region to form a transistor source region from the source epitaxial region and the first portion, said transistor source region having a bottom surface at said cavity; and
        applying an anneal temperature to both the drain epitaxial region and a second portion of the semiconductor layer underlying the drain epitaxial region to form a transistor drain region from the drain epitaxial region and the second portion, said transistor source region having a bottom surface at said cavity;
    wherein a third portion of the semiconductor layer between the transistor source region and transistor drain region and over said cavity forms a transistor channel region; and
    forming a transistor gate electrode in said opening above the transistor channel region.

2. The method of claim 1, further comprising forming trench isolations to delimit an active region of said semiconductor layer.

3. The method of claim 1, wherein the semiconductor layer is an upper semiconductor layer of a silicon on insulator (SOI) substrate.

4. The method of claim 1, wherein forming the support structure comprises:
    forming a lower semiconductor layer; and
    forming the insulating layer on the lower semiconductor layer.

5. The method of claim 4, wherein the semiconductor layer and lower semiconductor layer are made of a same semiconductor material.

6. The method of claim 5, wherein the epitaxial layer is made of said same semiconductor material.

7. The method of claim 6, wherein the semiconductor material is selected from the group consisting of a silicon-germanium material and an indium-gallium-arsenic material.

8. The method of claim 4, wherein said lower semiconductor is a stress released semiconductor layer layer.

9. The method of claim 4, further comprising:
    forming a stress released semiconductor layer;
    recessing a portion of said stress released semiconductor layer; and
    wherein the semiconductor layer, the insulating layer and the lower semiconductor layer are formed in the recessed portion of said stress released semiconductor layer.

10. The method of claim 1, wherein forming the opening comprises:
    forming a dielectric layer over the epitaxial layer of semiconductor material;
    forming a first opening extending through the dielectric layer at the position where the gate is to be located;
    forming sidewall spacers on side walls of the first opening to define a second opening; and
    extending the second opening through said epitaxial layer of semiconductor material to form said opening.

11. The method of claim 1, wherein forming the opening comprises:
    forming a sacrificial layer over the epitaxial layer of semiconductor material;
    patterning the sacrificial layer to define a dummy gate at the position where the gate is to be located;
    forming sidewall spacers on side walls of the dummy gate;
    removing the dummy gate between the sidewall spacers to define a first opening; and
    extending the first opening through said epitaxial layer of semiconductor material to form said opening.

12. The method of claim 1, further comprising forming sidewall spacers on side walls of the opening and before performing said steps of applying the anneal temperature.

13. The method of claim 1, wherein forming the transistor gate electrode comprises:
    depositing a dielectric layer in the opening;
    depositing a metal liner on the dielectric layer; and
    filling said opening with a metal material.

14. The method of claim 1, wherein the steps of applying the anneal temperature comprise performing a laser annealing of the epitaxial regions and underlying portions of the semiconductor layer.

15. A method, comprising:
forming an upper semiconductor layer over a lower semiconductor layer with an insulating layer positioned between the upper semiconductor layer and the lower semiconductor layer;
removing material of the insulating layer to form a cavity under the upper semiconductor layer;
growing an epitaxial layer of semiconductor material on the upper semiconductor layer;
forming an opening in said epitaxial layer of semiconductor material to define a source epitaxial region and a drain epitaxial region separated by said opening, said source epitaxial region overlying a source substrate region of the upper semiconductor layer and said drain epitaxial region overlying a drain substrate region of the upper semiconductor layer;
after said cavity and said opening have been formed, then:
simultaneously annealing both the source epitaxial region and source substrate region through to the cavity to form a transistor source region from the source epitaxial region and source substrate region; and
simultaneously annealing both the drain epitaxial region and drain substrate region through to the cavity to form a transistor drain region from the drain epitaxial region and drain substrate region;
wherein a portion of the semiconductor substrate layer between the source and drain substrate regions forms a transistor channel region with said cavity extending under said transistor channel region; and
forming a transistor gate electrode in said opening above the transistor channel region.

16. The method of claim 15, wherein the steps of simultaneously annealing comprise performing a laser annealing.

17. The method of claim 15, wherein forming the opening comprises:
forming a dielectric layer over the epitaxial layer of semiconductor material;
forming a first opening extending through the dielectric layer;
forming sidewall spacers on side walls of the first opening to define a second opening; and
extending the second opening through said epitaxial layer of semiconductor material to form said opening.

18. The method of claim 15, wherein forming the opening comprises:
forming a sacrificial layer over the epitaxial layer of semiconductor material;
patterning the sacrificial layer to define a dummy gate;
forming sidewall spacers on side walls of the dummy gate;
removing the dummy gate between the sidewall spacers to define a first opening; and
extending the first opening through said epitaxial layer of semiconductor material to form said opening.

19. The method of claim 15, further comprising forming sidewall spacers on side walls of the opening and before performing said steps of simultaneously annealing.

20. The method of claim 15, wherein forming the transistor gate electrode comprises:
depositing a dielectric layer in the opening;
depositing a metal liner on the dielectric layer; and
filling said opening with a metal material.

21. A method, comprising:
growing an epitaxial layer of semiconductor material on a semiconductor layer which overlies an insulating layer supported by a substrate;
forming trench isolations in the semiconductor layer to define an active region;
removing the insulating layer within the active region to provide a cavity under the semiconductor layer;
forming an opening in said epitaxial layer of semiconductor material to define a source epitaxial region and a drain epitaxial region separated by said opening, said source epitaxial region overlying a source substrate region of the semiconductor substrate layer and said drain epitaxial region overlying a drain substrate region of the semiconductor substrate layer;
annealing to combine both the source epitaxial region and source substrate region into a transistor source region over said cavity;
annealing to combine both the drain epitaxial region and drain substrate region into a transistor drain region over said cavity;
wherein a portion of the semiconductor substrate layer between the source and drain substrate regions forms a transistor channel region over said cavity; and
forming a transistor gate electrode in said opening above the transistor channel region.

22. The method of claim 21, wherein forming the opening comprises:
forming a dielectric layer over the epitaxial layer of semiconductor material;
forming a first opening extending through the dielectric layer;
forming sidewall spacers on side walls of the first opening to define a second opening; and
extending the second opening through said epitaxial layer of semiconductor material to form said opening.

23. The method of claim 21, wherein forming the opening comprises:
forming a sacrificial layer over the epitaxial layer of semiconductor material;
patterning the sacrificial layer to define a dummy gate;
forming sidewall spacers on side walls of the dummy gate;
removing the dummy gate between the sidewall spacers to define a first opening; and
extending the first opening through said epitaxial layer of semiconductor material to form said opening.

24. The method of claim 21, further comprising forming sidewall spacers on side walls of the opening and before performing said steps of annealing.

25. The method of claim 21, wherein forming the transistor gate electrode comprises:
depositing a dielectric layer in the opening;
depositing a metal liner on the dielectric layer; and
filling said opening with a metal material.

* * * * *